United States Patent
Yajima et al.

(10) Patent No.: US 10,101,652 B2
(45) Date of Patent: *Oct. 16, 2018

(54) EXPOSURE METHOD, METHOD OF FABRICATING PERIODIC MICROSTRUCTURE, METHOD OF FABRICATING GRID POLARIZING ELEMENT AND EXPOSURE APPARATUS

(71) Applicant: USHIO DENKI KABUSHIKI KAISHA, Tokyo (JP)

(72) Inventors: Daisuke Yajima, Tokyo (JP); Kentaro Nomoto, Tokyo (JP); Yohei Nawaki, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 15/310,108

(22) PCT Filed: Sep. 24, 2015

(86) PCT No.: PCT/JP2015/004864
§ 371 (c)(1),
(2) Date: Nov. 10, 2016

(87) PCT Pub. No.: WO2017/051443
PCT Pub. Date: Mar. 30, 2017

(65) Prior Publication Data
US 2017/0261847 A1 Sep. 14, 2017

(51) Int. Cl.
*G03F 7/20* (2006.01)
*G03F 7/00* (2006.01)
(Continued)

(52) U.S. Cl.
CPC ......... *G03F 7/0005* (2013.01); *G02B 5/3075* (2013.01); *G03F 7/201* (2013.01);
(Continued)

(58) Field of Classification Search
None
See application file for complete search history.

(56) References Cited

U.S. PATENT DOCUMENTS 3,567,305 A * 3/1971 Collier et al. ........... G03H 1/24
356/457
4,547,037 A * 10/1985 Case ....................... G02B 5/32
359/15
(Continued)

FOREIGN PATENT DOCUMENTS

JP 57-081228 * 5/1982
JP 10-078503 * 3/1998
(Continued)

OTHER PUBLICATIONS

International Search Report issued in PCT/JP2015/004864; dated Dec. 28, 2015.
(Continued)

*Primary Examiner* — Martin J Angebranndt
(74) *Attorney, Agent, or Firm* — Studebaker & Brackett PC

(57) ABSTRACT

Disclosed herein an exposure apparatus capable of implementing a microfabrication onto a work with a higher throughput and a lower cost. The exposure apparatus generates interfering light by crossing two or more branched light beams branched from output light from a coherent light source at a predetermined interfering angle, and exposes the substrate by repeating an irradiation onto the substrate with the interfering light and a conveyance of the substrate. At this moment, the exposure apparatus shapes in interfering light irradiation region on the substrate onto which the interfering light is irradiated into a predetermined shape. Then, the exposure apparatus disposes a plurality of the interfering light irradiation regions in successive shots to be located adjacent to each other on the substrate in a direction (Continued)

of conveying the substrate without the interfering light irradiation regions being overlapped when exposing the substrate while conveying the substrate in a stepwise manner.

10 Claims, 21 Drawing Sheets

(51) Int. Cl.
  *G02B 5/30* (2006.01)
  *G03F 7/22* (2006.01)

(52) U.S. Cl.
  CPC ................ *G03F 7/203* (2013.01); *G03F 7/22* (2013.01); *G03F 7/70408* (2013.01); *G03F 7/70475* (2013.01); *G02B 5/3058* (2013.01)

(56) References Cited

U.S. PATENT DOCUMENTS

| | | | |
|---|---|---|---|
| 4,787,688 A * | 11/1988 | Rumfola | G02B 26/106 359/18 |
| 5,585,211 A * | 12/1996 | Firstein | G03F 7/70558 250/492.3 |
| 6,882,477 B1 * | 4/2005 | Schattenburg | G03F 7/70383 359/35 |
| 7,867,692 B2 | 1/2011 | Amako et al. | |
| 8,198,609 B2 | 6/2012 | Park et al. | |
| 2005/0205884 A1 * | 9/2005 | Kim | H01L 33/18 257/98 |
| 2006/0001861 A1 * | 1/2006 | Wegmann | G03F 7/706 356/124 |
| 2007/0023692 A1 * | 2/2007 | Stenger | G03F 7/70408 250/492.2 |
| 2009/0039293 A1 | 2/2009 | Park et al. | |
| 2017/0090289 A1 * | 3/2017 | Yajima | G03F 7/16 |

FOREIGN PATENT DOCUMENTS

| | | | |
|---|---|---|---|
| JP | 2002-198301 | * | 7/2002 |
| JP | 2004-014866 A | | 1/2004 |
| JP | 2009-044158 A | | 2/2009 |
| JP | 4389791 B2 | | 12/2009 |
| JP | 4514317 B2 | | 7/2010 |
| JP | 2015-170780 A | | 9/2015 |

OTHER PUBLICATIONS

Written Opinion issued in PCT/JP2015/004864; dated Dec. 28, 2015.

* cited by examiner

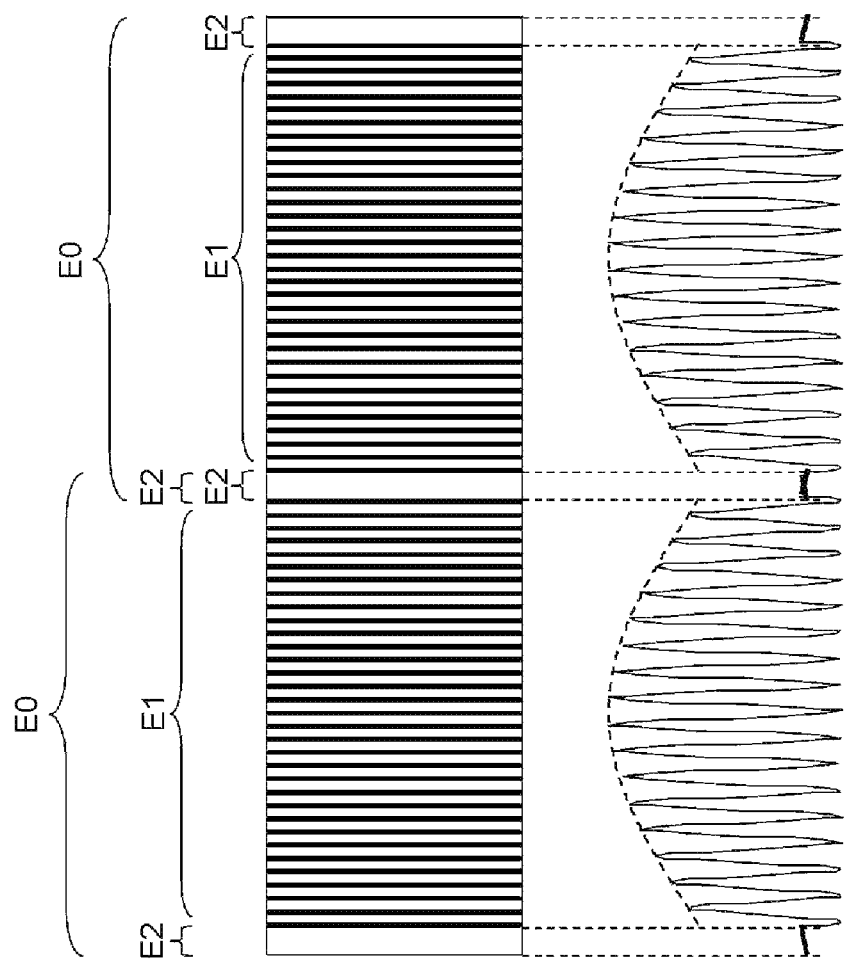

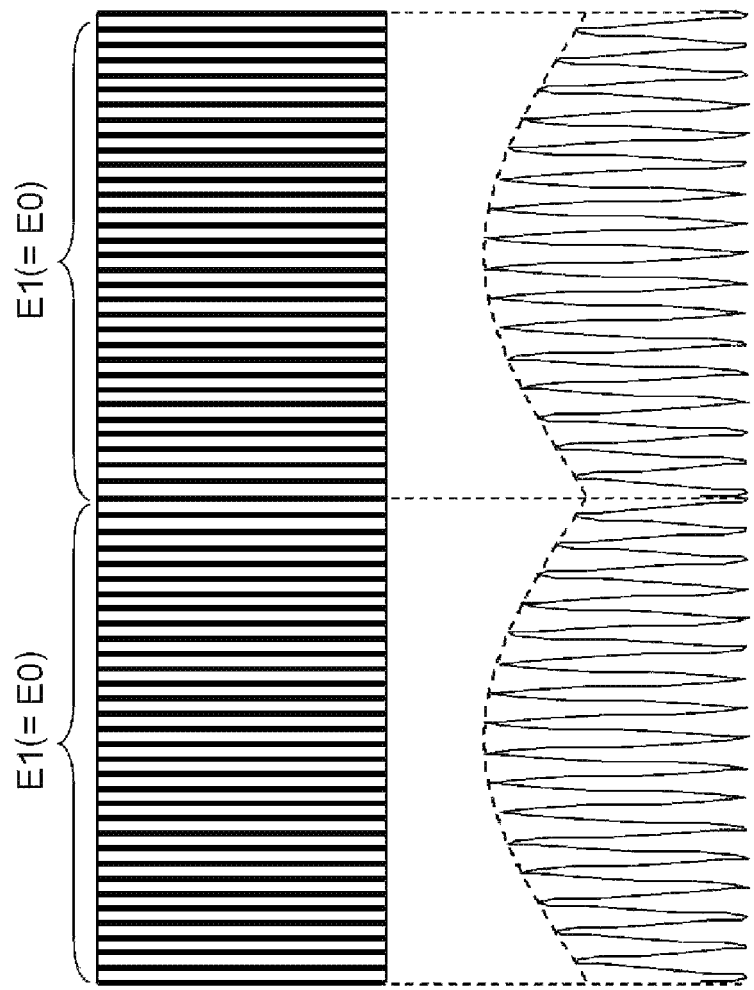

EXPOSURE METHOD, METHOD OF FABRICATING PERIODIC MICROSTRUCTURE, METHOD OF FABRICATING GRID POLARIZING ELEMENT AND EXPOSURE APPARATUS

FIELD OF THE INVENTION

The present invention relates to an exposure method of implementing a fine periodic pattern on a substrate, a method of fabricating a periodic microstructure using the exposure method, a method of fabricating a grid polarizing element, and an exposure apparatus.

DESCRIPTION OF THE RELATED ART

Conventionally, as a method of implementing a microfabrication or a fine processing, the two-beam interference exposure method has been known. The two-beam interference exposure method herein is a method that causes two laser beams to cross each other at a predetermined angle to generate interfering (or coherent) light (i.e., an interference fringe or an interference stripe) that has a contrast (i.e., a light intensity distribution) at a pitch similar to or less than a wavelength of the laser beam, and to irradiate a substrate with the interfering light generated. The above mentioned two-beam interference exposure method branches light from a light source having a high coherency (interference), such as a laser or the like, into two light beams and causes the two light beams to interfere each other. Accordingly, it makes it possible to attain a fine and periodic exposure illuminance distribution without a fine mask being prepared.

A technique employing the above mentioned two-beam interference exposure method is disclosed in, for example, Japanese Patent Publication No. 4389791 B (Patent Literature 1). According to the technique disclosed in the Patent Literature 1, light from a laser light source is branched by a diffraction type beam splitter into 0 order light beam and ±1 order light beams, and respective ±1 order light beams are caused to interfere each other through a light condensing lens (condenser), a spatial filter, and a mirror on a substrate supported by a stage to expose a photosensitive film on the substrate. Here, the stage supporting the substrate has a degree of rotational freedom, and by performing the exposure twice, it is possible to obtain a microstructure (microstructural body) in which a circular cylinder or a circular cone or the like is periodically arranged.

Also, another technique similarly employing the above mentioned two-beam interference exposure method is disclosed in, for example, Japanese Patent Publication No. 4514317 B (Patent Literature 2). According to the technique disclosed in the Patent Literature 2, the stage is driven in a stepwise manner, and multiple exposure (exposing operations) are performed in an overlapping manner on a workpiece so that the exposure intensity distribution is assumed to be constant in a certain range on the workpiece. In the Patent Literature 2, the interference fringe in an each exposure (exposing operation) is scan controlled such that the multiple interference fringes generated in multiple exposure operations are overlapped one another.

LISTING OF REFERENCES

Patent Literatures

Patent Literature 1: Japanese Patent 4389791 B
Patent Literature 2: Japanese Patent 4514317 B

SUMMARY OF THE INVENTION

Problems to be Solved by the Invention

However, the technique disclosed in the Patent Literature 1 (Japanese Patent Publication No. 4389791 B) has a configuration in which the substrate is irradiated with the laser light of which beam diameter is enlarged by the light condensing lens and the spatial filter. For this reason, the light beam irradiated onto the substrate has a spherical wave. Further, at this moment, the interference fringe is formed such that an accumulated error (or accumulated inaccuracy) of the pitch becomes larger as the interference fringe becomes closer to an edge of an exposure region. For this reason, an effective exposure region is necessarily limited to the vicinity of a center of the light beam, particularly for an intended use application for fabricating a diffraction grating or the like, which requires equally spaced line patterns. As a result, in this case, a distance from the spatial filter to the substrate is required to be larger for exposing a large area of the substrate. It causes an apparatus to be necessarily large sized and the cost to be increased.

On the other hand, in the technique disclosed in the Patent Literature 2 (Japanese Patent Publication No. 4514317 B), the stage is required to be controlled with a similar degree of accuracy to the interference pitch in order to scan control the interference fringe. In other words, more particularly, the stage is required to have a stability in stopping and a repeat accuracy (or repeatability) in the order of submicron to nm in order to expose in an overlapping manner with a fine interference pitch, which makes the control be more difficult. In addition, as effective exposure regions to be irradiated with the interfering light are to be overlapped, the number of shots onto the substrate increases so as to deteriorate the throughput.

Yet furthermore, the pitch of the interference fringe is required to be stable in order to cause the effective exposure regions to be overlapped. In this regard, in the two-beam interference exposure, the disturbance on a wave surface (or wave front) of the interference beam causes the pitch error to increase so that an ideal plane wave is instead required. In general, as the lens has the aberration, it is required to narrow down the beam diameter and solely use the center portion of the lens in order to obtain the ideal plane wave. On other words, the effective exposure region is necessarily required to be smaller. It causes the number of shots to increase and the throughput to be lowered.

The present invention has been made in view of the above mentioned circumstances and an object thereof is to provide an exposure method, a method for fabricating a periodic microstructure, a method for fabricating a grid polarizing element, and an exposure apparatus that are capable of implementing a microfabrication onto a workpiece with the higher throughput yet the lower fabricating cost.

Solution to the Problem

In order to solve the above mentioned problems, according to one aspect of an exposure method of the present invention, there is provided an exposure method for exposing a substrate by repeating an irradiation onto the substrate with interfering light and a conveyance of the substrate, the method comprising: generating interfering light by crossing, at a predetermined angle, two or more light beams branched from output light from a coherent light source; shaping, into a predetermined shape, an interfering light irradiation region which is a region on the substrate on which the interfering light is irradiated per one shot; and disposing a plurality of the interfering light irradiation regions in successive shots to be located adjacent to each other on the substrate in a direction of conveying the substrate without the interfering light irradiating regions being overlapped when the substrate is exposed while being conveyed in a stepwise manner.

With this configuration, as the substrate is exposed in a unit of small segment while the substrate is conveyed in a stepwise manner, it makes it possible to expose a large area of the substrate without causing an apparatus to be large sized. For this reason, it makes it possible to reduce the cost incurred by making the apparatus be large sized. In addition, the interfering light irradiation regions in the successive shots are aligned with each other without the interfering light irradiation regions being overlapped. Thus, it makes it possible to reduce the number of the shots as compared to a conventional exposure method in which the interfering light irradiation regions are overlapped. Also, it makes it possible to reduce the number of settling (or setting, positioning) of the stage that conveys the substrate. As a result, it makes it possible to shorten the exposure time for exposing the entire substrate as a whole so that the throughput can be improved.

Also, according to another aspect of the present embodiment of the exposure method, it is preferable to arrange a light shielding member, having a light transmissive part of a predetermined shape on the substrate so that the interfering light irradiation region may be shaped into a rectangular or a substantially rectangular shape.

With this configuration, it makes it possible to shape the interfering light irradiation region in a relatively simplified and easy manner. In addition, as the exposure region is shaped into a rectangular shape in the two-beam interference exposure, it makes it possible to align the interfering light irradiation regions in the successive shots one another on the substrate without the interfering light irradiation regions being overlapped.

Also, according to yet another aspect of the present invention of the exposure method, the light shielding member may be arranged above the substrate with a predetermined gap being provided. Thus, a non-interfering light irradiation region, which is irradiated with non-interfering light that is a part of at least two branched light beams, may be formed at an end of the interfering light irradiation region. When the substrate is being exposed while the substrate is being conveyed in a stepwise manner, a plurality of the neighboring non-interfering light irradiation regions that are formed at the ends of the neighboring interfering light irradiation region in a direction of conveying the substrate may be overlapped each other.

With this configuration, as the non-interfering light irradiation regions are used for overlapping, it makes it possible to effectively prevent the interfering light irradiation regions from being overlapped each other, in other words, from being overly (or excessively) exposed. Also, the non-interfering light irradiation region may be used as an indicator (or reference) for aligning the interfering light irradiation regions one another. In addition, as the gap is provided between the light shielding member and the substrate, it makes it possible to prevent particles or the like from attaching to the substrate due to the both of the light shielding member and the substrate adhering each other.

Also, according to yet another aspect of the present invention of the exposure method, the light shielding member may be arranged above the substrate with a predetermined gap being provided. Thus, a non-interfering light irradiation region, which are irradiated with non-interfering light that is a part of at least two branched light beams, may be formed at an end of the interfering light irradiation region. When the substrate is being exposed while the substrate is being conveyed in a stepwise manner, the interfering light irradiation region may be overlapped with the non-interfering light irradiation region that is formed at the end of a neighboring interfering light irradiation region in a direction of conveying the substrate.

With this configuration, as the non-interfering light irradiation region is used for overlapping, it makes it possible to effectively prevent the interfering light irradiation regions from being overlapped each other, in other words, from being overly (or excessively) exposed. Also, as the non-interfering light irradiation region and the interfering light irradiation region, adjacent to each other in the direction of conveying the substrate, are overlapped, it makes it possible to reduce or eliminate the non-interfering light irradiation region which intervenes between the interfering light irradiation regions adjacent each other in the substrate conveying direction (that is, a dead zone). In addition, as the gap is provided between the light shielding member and the substrate, it makes it possible to prevent particles or the like from attaching to the substrate due to the both of the light shielding member and the substrate adhering each other.

Also, according to yet another aspect of the present invention, the light shielding member may be arranged directly on the substrate.

With this configuration, as the light shielding member is arranged directly on the substrate, the non-interfering light irradiation regions are not formed at both sides of the interfering light irradiation region in the substrate conveying direction. For this reason, it makes it possible to allow an area of the interfering light irradiation region to be broader, as compared to the case in which the light shielding member is arranged above the substrate with the gap being provided. In other words, it makes it possible to broaden an area that can be exposed per one shot so that the number of shots can be reduced that is required for exposing a certain area.

Also, according to one aspect of a method for fabricating a periodic microstructure of the present invention, there is provided a method comprising: exposing a substrate according to any one of the above mentioned exposure methods; and imparting, to the substrate, a physical property corresponding to the interfering fringe or forming, on the substrate, a pattern corresponding to the interfering fringe.

With this configuration, it makes it possible to fabricate the periodic microstructure with the higher throughput and the lower cost.

Also, according to another aspect of the method for fabricating a periodic microstructure of the present invention, there is provided a method comprising: a step of exposing the substrate according to any one of the above mentioned exposure methods; and a step of developing the substrate after being exposed and forming a pattern corresponding to the interfering fringe on the substrate.

With this configuration, it makes it possible to fabricate the periodic microstructure with the higher throughput and the lower cost.

Also, according to one aspect of a method for fabricating a grid polarizing element (or polarizer), there is provided a method comprising: a step of forming on a transparent substrate an inorganic dielectric layer composed of an inorganic dielectric substance (body); a step of forming on the inorganic dielectric layer a photosensitive layer composed of a photosensitive material; a step of exposing the photosensitive layer by use of any one of the above mentioned exposure methods; a step of developing the photosensitive layer after being exposed and forming a pattern corresponding to the interfering fringe on the photosensitive layer; and removing the inorganic dielectric layer by an etching based on the pattern formed on the photosensitive layer and forming a grid layer composed of the inorganic dielectric substance that has a periodic microstructure.

With this configuration, it makes it possible to fabricate the grid polarizing element (polarizer) with the higher throughput and the lower cost.

Also, according to another aspect of the present invention, it is preferable that the photosensitive layer is exposed such that a proportion (or ratio) of an area of the non-interfering light irradiation region with respect to an area of the interfering light irradiation region is less than 0.4%.

With this configuration, it makes it possible to attain the extinction ratio at a level without a problem practically, and to assure the performance as the grid polarization element.

Yet also, according to yet another aspect of an exposure apparatus of the present invention, there is provided an exposure apparatus comprising: a light source configured to emit coherent light; an optical system configured to cross at least two light beams that are branched from output light from the light source each other at a predetermined interference angle and generate interfering light; a light shielding member arranged on a substrate and configured to have a light transmissive part of a predetermined shape through which the interfering light generated by the optical system transmits; and a substrate conveyance controlling unit configured to repeat an irradiation onto the substrate with the interfering light, which has transmitted through the light transmissive part of the light shielding member, and a conveyance of the substrate to expose the substrate. The substrate conveyance controlling unit conveys the substrate in a stepwise manner so as to dispose a plurality of interfering light irradiation regions in successive shots to be located adjacent to each other on the substrate in a direction of conveying the substrate without the interfering light irradiation regions being overlapped. And the interfering light irradiation region is shaped into a predetermined shape through the light transmissive part of the light shielding member.

With this configuration, as the exposure apparatus exposes the substrate in a unit of a small segment while conveying the substrate in the stepwise manner, it makes it possible to expose a large area of the substrate without causing the apparatus to be large sized. For this reason, it makes it possible to reduce the cost associated with making the apparatus be large sized. In addition, as the interfering light irradiation regions are aligned with each other without the interfering light irradiation regions being overlapped, it makes it possible to reduce the number of shots as compared to an exposure method in which the interfering light irradiation regions are overlapped. For this reason, it makes it possible to reduce the number of settling of the stage carrying the substrate. As a result, it makes it possible to reduce the exposure time for exposing the entire substrate as a whole and to improve the throughput.

Also, according to yet another aspect of the present invention, it is preferable that the optical system may be provided with a light branching element configured to branch the output light from the light source into two or more light beams; and angle variable mirrors configured to deflect the branched light beams towards the substrate, respectively, so as to cross the branched two or more light beams branched by the light branching element each other at a desired interference angle.

With this configuration, as the interference angle of the two light beams, which are branched by the light branching element, may be modified to any desired angle, it makes it possible to universally modify the pitch of the interfering fringes of the striped shape which are formed on the substrate so as to be applied to various intended use applications.

Advantageous Effect of the Invention

According to the present embodiments of the present invention, as the so-called "step-and-repeat" type exposure is employed, which exposes the substrate while conveying the substrate in the stepwise manner, it makes it possible to allow the apparatus to be small sized and also to reduce the cost to be lower. Also, according to the present embodiment of the present invention, in the two-beam interference exposure, the interfering light irradiation regions in successive shots are exposed such that the interfering light irradiation regions are aligned with each other in the substrate conveying (or conveyance) direction without the interfering light irradiation regions being overlapped. For this reason, it makes it possible to reduce the number of shots as compared to a method in which the interfering light irradiation regions are overlapped. As a result, it makes it possible to improve the throughput in the exposure.

As mentioned above, it makes it possible to attain the fine processing (microfabrication) to the substrate with the higher throughput and the lower cost.

The above mentioned and other not explicitly mentioned objects, aspects and advantages of the present invention will become apparent to a skilled person from the following detailed description when read and understood in conjunction with the appended claims and drawings.

BRIEF DESCRIPTION OF THE DRAWINGS

FIG. 5A is a view showing an exposure method according to the first embodiment of the present invention;

FIG. 5B is a view showing an exposure method according to the first embodiment of the present invention;

FIG. 15A is a view showing an exposure method according to a third embodiment of the present invention;

FIG. 15B is a view showing an exposure method according to a third embodiment of the present invention;

DETAILED DESCRIPTION OF THE INVENTION

Hereinafter, referring to the accompanying drawings, the present invention will be described in detail in an exemplary embodiments below.

First Embodiment

Figure 1:
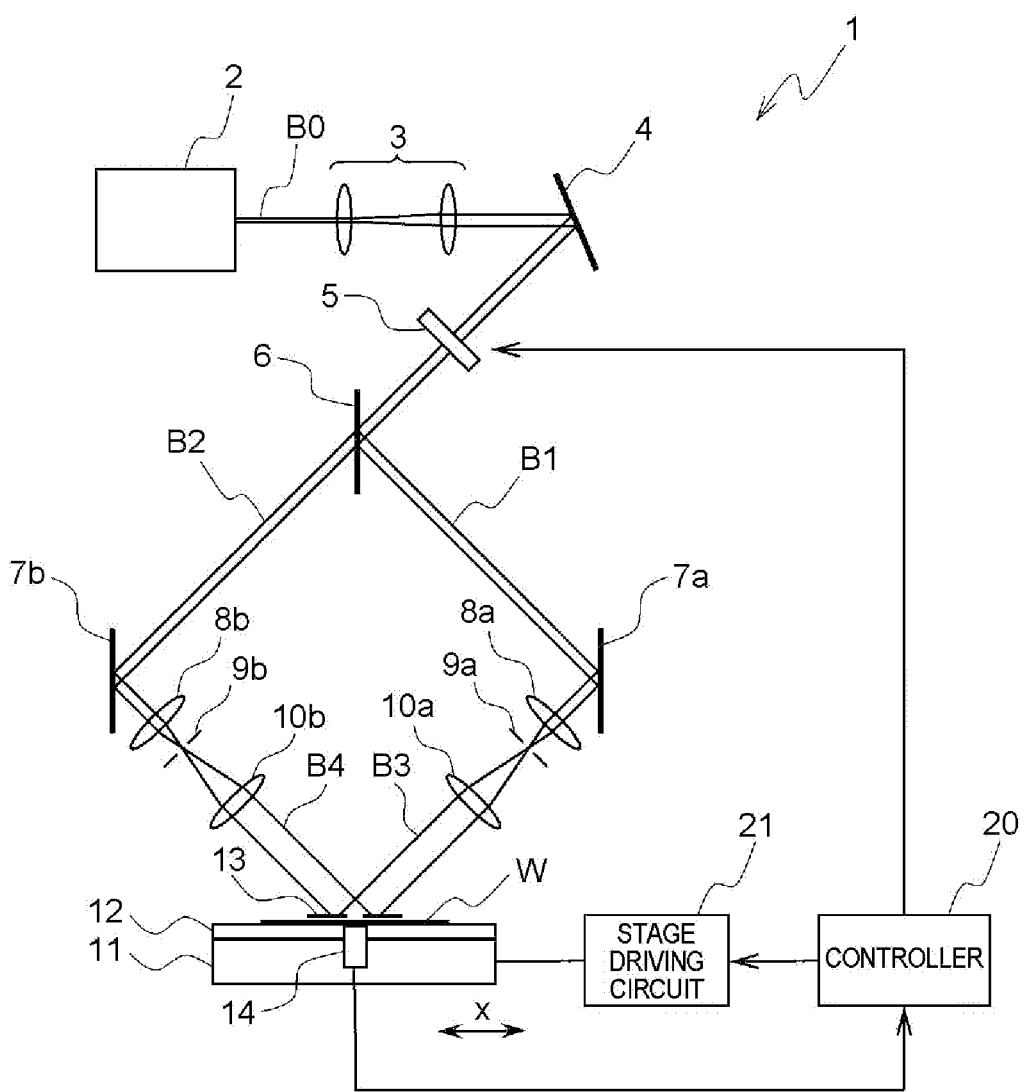
FIG. 1 is a view schematically showing an exemplary configuration according to a first embodiment of an exposure apparatus of the present invention.

FIG. 1 is a view schematically showing an exemplary configuration of an exposure apparatus according to the present invention.

In FIG. 1, reference sign 1 denotes the exposure apparatus. The exposure apparatus is provided with a light source 2, a beam expander 3, a downwardly deflecting mirror 4; a shutter 5, a beam branching element 6, a reflecting (or folding) mirrors 7a and 7b, a light condensing (condenser) lenses 8a and 8b, pinholes 9a and 9b, and collimating lenses 10a and 10b. Furthermore, the exposure apparatus 1 may be provided with a stage 11, an adhesive disk 12, a mask 13, a gap sensor 14, a controller 20, and a stage driving circuit 21.

The light source 2 is a coherent light source which emits coherent light, and for example, a semiconductor excited (pumped) solid laser that emits the laser light having a wavelength λ of, for example, 266 nm. The beam diameter of the laser light B0, emitted from the light source 2, is expanded (enlarged) by the beam expander 3, and then a light path of the laser light B0 is deflected by the downwardly deflecting mirror 4.

The shutter 5 is provided for switching ON/OFF of the laser light emission, and is arranged between the mirror 4 and the beam branching element 6. The controller 20 controls an opening and closing of the shutter 5.

The beam branching element 6 branches one laser light beam into two laser light beams to be generated. The beam branching element 6 is, for example, an uneven shaped type diffracting (diffraction) grating, which implements the function thereof by using the shape (geometric) effect by virtue of a fine uneven shape applied onto a surface of a quartz or the like.

Two laser light beams B1 and B2 generated by the beam branching element 6 are reflected by the reflecting mirrors 7a and 7b, respectively, and enter into the light condensing lenses 8a and 8b, respectively.

The laser light after being condensed by the light condensing lens 8a enters (is incident) into the pinhole 9a, and after the beam diameter of the laser beam is expanded (enlarged), the incident laser beam is collimated by the collimating lens 10a. In this way, the laser light B3, which is collimated, is obtained. Likewise, the laser light after being condensed by the light condensing lens 8b enters (is incident) into the pinhole 9b, and after the beam diameter of the laser beam is expanded (enlarged), the incident laser beam is collimated by the collimating lens 10b. In this way, the laser light B4, which is collimated, is obtained.

At this time, the pinholes 9a and 9b function as spatial filters, respectively. More particularly, the pinholes 9a and 9b are used for eliminating the disturbance of the beam wave surface, which occurred in the light paths till the laser lights reach the light condensing lenses 8a and 8b, respectively. Subsequently, the collimating lenses 10a and 10b are used for allowing the wave surface of the laser light to be ideal plane wave, respectively.

Figure 2:
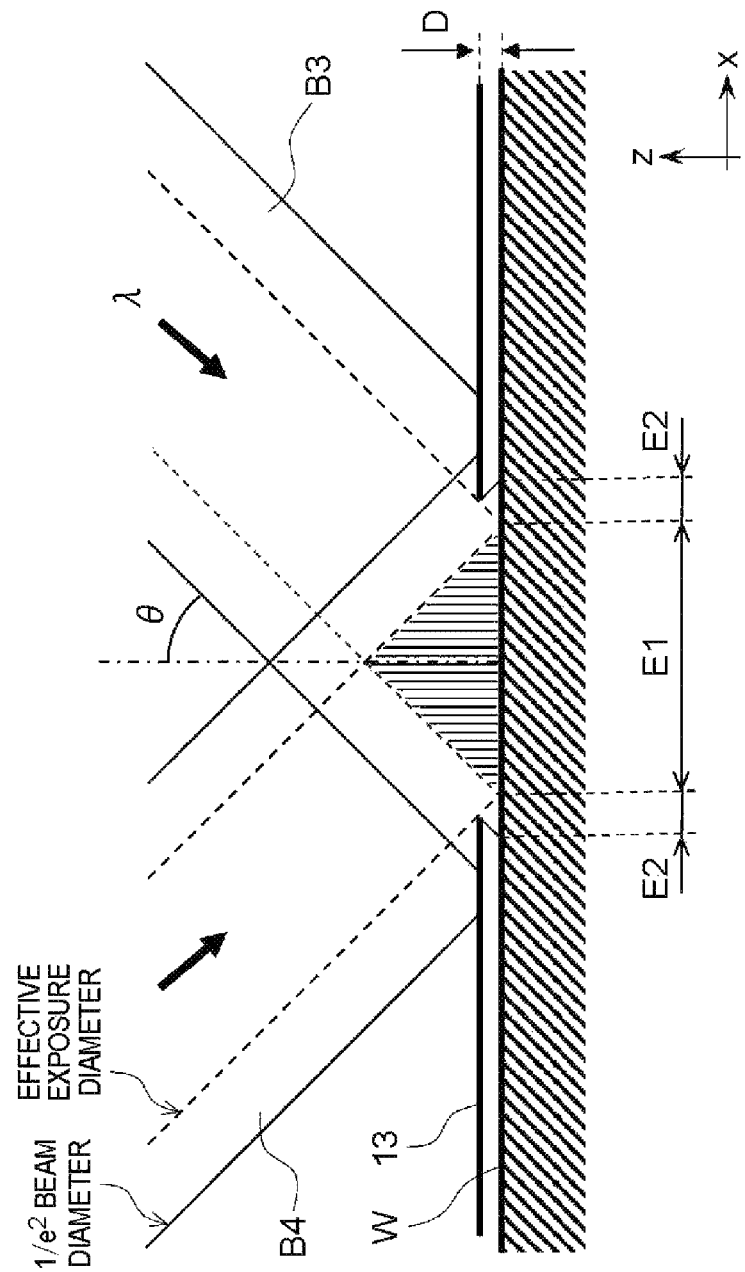
FIG. 2 is a view schematically showing an effective irradiation region being formed.

The two laser light beam B3 and B4 are, as shown in FIG. 2, are caused to be crossed at a predetermined interference angle 2θ. It causes the two laser light beams B3 and B4 to interfere each other above the workpiece (substrate) W to generate interference fringes. The generated interference fringes are then irradiated onto the workpiece W, as an exposure light. In other words, the interference fringes having a stripe shaped line-and-space are transcribed onto the workpiece W.

As described above, the optical system, which includes a beam expander 3, the downwardly deflecting mirror 4, the shutter 5, the beam branching element 6, the reflecting mirrors 7a and 7b, the light condensing lenses 8a and 8b, the pinholes 9a and 9b, and the collimating lenses 10a and 10b, causes the two (bifurcated) light beams branched from the output light from the light source 2 to be crossed at the interference angle 2θ to generate the interfering light. Within the optical system, all elements between the beam branching element 6 and the workpiece W are provided to be a pair. By paring those elements, the two laser light beams branched by the beam branching element 6 are guided towards the workpiece W and shaped, and then caused to interfere each other above the workpiece W, respectively.

Now referring back to FIG. 1, the workpiece W is fixed on the adhesive disk 12 provided on the stage 11. In this disclosure, the workpiece W may include a substrate to which a resist film is applied (or coated), a glass substrate, and a substrate to which the self-assembled monolayers (SAM) film is applied (or coated) and the like. With those kinds of the workpiece W being exposed by the interfering light, it makes it possible to form a grid pattern made of a dielectric fine wire, to form the diffracting grating, or otherwise to form an organic transistor element or the like on the substrate.

The stage 11 has a degree of freedom to move in the X-Y direction with respect to a surface of the workpiece W. The controller 20 is configured to be capable of moving the stage 11 in the X-Y direction by drive controlling the stage driving circuit 21. In other words, the workpiece W is moved in the X-Y direction by moving the stage 11 in the X-Y direction. Hereinafter and throughout the specification, the X direction is referred to as a horizontal (right and left) direction in FIG. 1, and the Y direction is referred to as a vertical direction to a paper surface in FIG. 1.

According to the present invention, taking the aberration of the lens into consideration, the workpiece W is exposed by using light extracted solely in the vicinity of the center of the collimating lenses 10a and 10b. More particularly, a mask 13 having a rectangular shaped opening (i.e., a light transmissive part) is arranged above the workpiece W. Then, the workpiece W is irradiated with the interfering light that is formed by extracting, through the mask 13, solely in the vicinity of the center of the light that has transmitted through the collimating lenses 10a and 10b, as the exposure light.

The mask 13 is configured with a light shielding member having a light transmissive part of the rectangular shape. In the present embodiment, the mask 13 may be a member in which a rectangular opening is formed substantially in the center of the substrate made of metal. It should be noted that, alternatively, the mask 13 may be a member in which a light shielding film is formed on a transparent substrate such as glass, the shielding film having a light transmissive part of the rectangular shape from which the transparent substrate is exposed. In the present embodiment, as the light shielding film, for example, a film made from chrome (chromium) may be used. Also, the light transmissive part may be in a shape close to the rectangle (that is, substantially rectangular shape).

With the above mentioned mask 13 being arranged above the workpiece W, it makes it possible to shape a region on the workpiece W that is to be irradiated per one shot into the rectangular shape by the mask 13 when the two light beams enter into the mask 13 at the interference angle 2θ. Hereinafter throughout the specification, the region on the workpiece W defined (or partitioned) by the rectangular opening of the mask 13 is referred to as an "effective irradiation region".

The rectangular opening of the mask 13 is formed such that the rectangular opening of the mask 13 is smaller than an irradiation region on the workpiece W to be irradiated with the light that has transmitted through the collimating lenses 10a and 10b. The rectangular opening has the size substantially similar to the effective irradiation region, for example, of 20.5 mm×13.8 mm.

An optimal size of the rectangular opening of the mask may vary depending on the condition of the exposure. For example, with the exposure condition of the wavelength λ=266 nm, the interference angle=47.6 degree (the interfering stripe L & S (line-and-space) pitch of 180 nm), the irradiation region ($1/e^2$ diameter of the beam) φ82 mm, the contrast of the interference fringe of 70%, the laser output power of 100 mW, and the photosensitive threshold of the resist of 5 mJ/cm$^2$, an 8 inch wafer is used as the workpiece, and 90% of a whole area is to be the exposure region. When the target line width is set to L=60±10 nm, then it is preferable that the size of the rectangular opening of the mask 13 is within the range of 8 mm×5 mm to 36 mm×24 mm. In particular, when the target line width is set to L=60±5 nm and the tact is equal to or less than 10 min/sheet, then it is more preferable that the size of the rectangular opening of the mask is within the range of 18 mm×12 mm to 24 mm×16 mm.

It should be noted that, assuming a long side of the rectangular opening of the mask 13 is "A" and a short side of the rectangular opening of the mask 13 is "B", when the relationship of A=B/cos θ, then it is possible to allow the area of the effective irradiation region per one shot to be the maximum.

It is possible to arbitrarily determine the beam diameter ($1/e^2$) of the laser light beams B3 and B4 depending on the magnifying power ratio of the beam expander 3, the collimating lenses 8a and 8b, and the collimating lenses 10a and 10b. For this reason, the size of the mask 13, including the amplitude of the corresponding beam diameter, can exchanged as appropriate as suitable for an intended use application.

Furthermore, the mask 13 is, as shown in FIG. 2, arranged with a gap D being provided with respect to the workpiece W. As shown in FIG. 1, a gap sensor 14 is embedded in the stage 11 and the adhesive disk 12. The gap sensor 14 is capable of measuring the distance between the adhesive disk 12 and the mask 13.

Yet furthermore, the mask 13 is retained by a holder which is capable of adjusting the distance from the adhesive disk 12. Prior to the exposure onto the workpiece W, the distance between the adhesive disk 12 and the mask 13 is adjusted such that a gap D is provided as appropriate depending on the thickness of the workpiece W to be fixed to the adhesive disk 12.

By arranging the mask 13 above the workpiece W with the gap D being provided, as shown in FIG. 2, on the workpiece W, there is generated a region onto which the interfering light of both of the laser light beams B3 and B4 is irradiated, and the other region onto which either one of the laser light beam B3 or the laser light beam B4 is irradiated. In other words, the effective irradiation region consists of an interfering light irradiation region E1 onto which the interfering light is irradiated (hereinafter also simply referred to as "interfering region") and a non-interfering light irradiation regions E2 generated by the geometric wraparound (sneak) of the light beam, which are formed at both sides of the interfering region in the X direction (hereinafter also simply referred to as "non-interfering region"). The width of the non-interfering region E2 depends on the gap D and the interference angle θ, and that is, 2D·tan θ.

Figure 3:
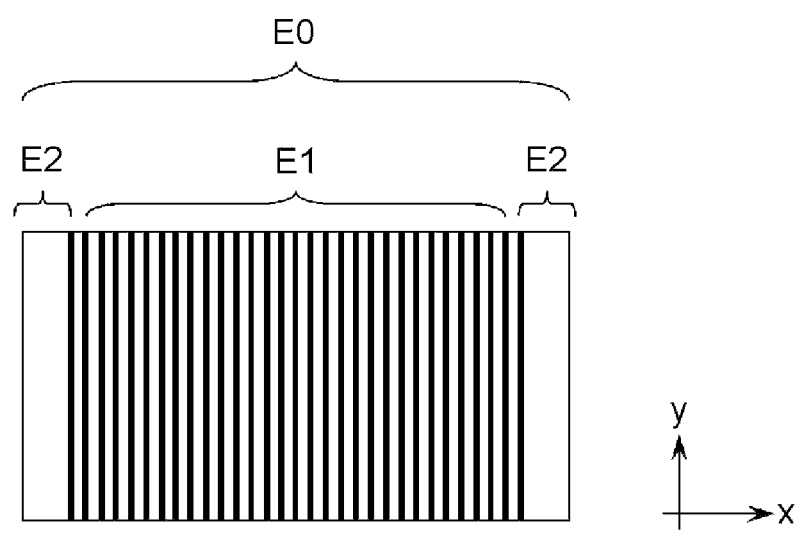
FIG. 3 is a view schematically showing an exemplary distribution or arrangement of an interfering light irradiation region and a non-interfering light irradiation region within the effective irradiation region.

FIG. 3 is a plain view showing the effective irradiation region E0 on the workpiece W. In the present embodiment, the horizontal direction in FIG. 3 is referred to as the X direction, and the vertical direction in FIG. 3 referred to as the Y direction. As shown in FIG. 3, the interfering region E1 is formed in the center part of the effective irradiation region E0 in the X direction, and the non-interfering regions E2 are formed at the both sides of the interfering region E1. The interference fringes are formed in the interfering region E1, while the interference fringes are not formed in the non-interfering region E2.

For example, when the wavelength λ of the light source 2=266 nm and the interference angle of 15 degrees≤θ≤60 degrees, then, in the interfering region E1, the interference fringes of the striped shape are formed of which pitch between neighboring lines is 154 nm to 514 nm. The pitch of the interference fringes depends on the interference angle θ, the wavelength λ of the light source 2, and the refractive index n of the exposure environment, and that is, λ/(2n·sin θ). In other words, assuming n=1 (that is, an exposure in the air), it is possible to shorten the pitch of the interference fringes down to approximately the half of the wavelength λ of the light source 2.

In the meantime, according to the present embodiment, the exposure apparatus 1 exposes the entire workpiece W as a whole using the "step-and-repeat" method. In the present embodiment, the step-and-repeat method is a method in which a region to be exposed on the substrate is partitioned into a plurality of small segments, the conveyance and exposure of the substrate are repeated, and each of the partitioned small segment is in turn exposed.

During the exposing step employing the step-and-repeat method, the controller 20 performs the stepping drive of the stage 11 and the opening-closing control of the shutter 5. In other words, the controller 20 moves the stage 11 mounting the workpiece W to a predetermined position, opens the shutter 5 to perform the stepping exposure. Subsequently, the controller 20 closes the shutter to terminate the stepping exposure, and then moves the stage 11 at a constant distance. The above described operations are repeatedly performed until all the exposure regions preset are exposed. The controller 20 operates as a substrate conveying unit.

Figure 4:
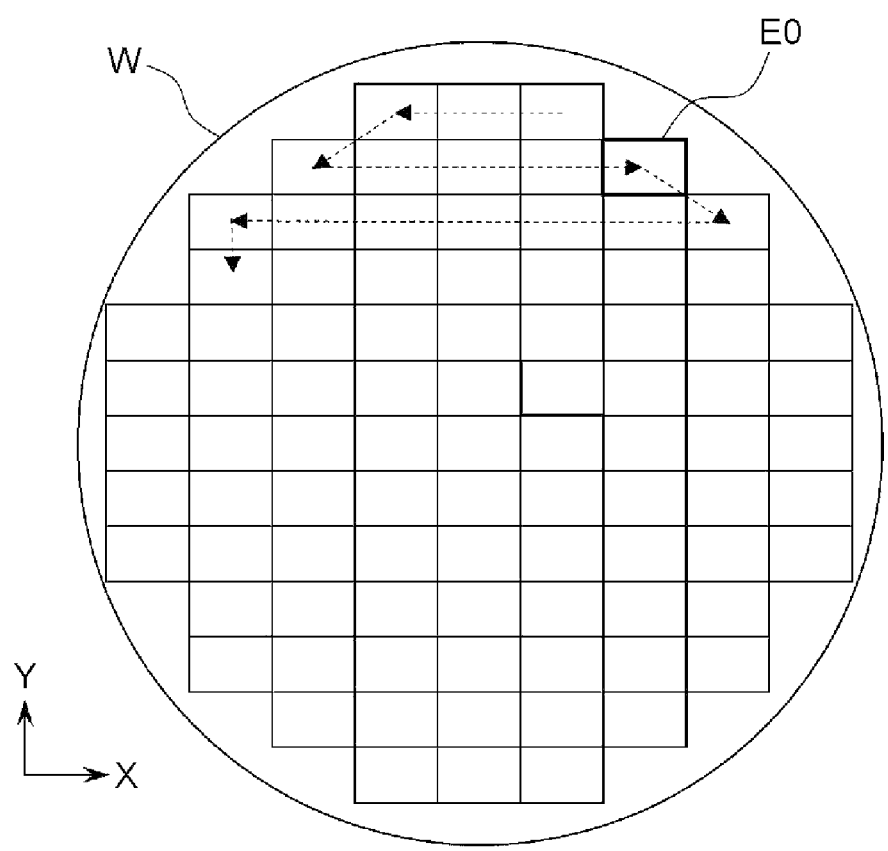
FIG. 4 is a view schematically showing an image of an exposure shot layout.

The exposure apparatus 1, as shown, for example, FIG. 4, starts the exposure operation from the upper right position of the work W, first conveys the workpiece W in the +X direction (i.e., right direction in FIG. 4), and then exposes the workpiece W in a first row while relatively moving the effective irradiation region E0 with respect to the workpiece W. In other words, the exposure apparatus 1 exposes the workpiece W in the first row while moving in the exposure region in turn in the −X direction from an upper right position of the workpiece W.

At this moment, as shown in FIG. 5A, the exposure apparatus 1 conveys the workpiece W such that the interfering region E1 at the m-th exposure within the effective irradiation region E0 and the interfering region E1 at the (m−1)-th exposure within the effective irradiation region E0 are not overlapped on the workpiece W, and also the non-interfering region E2 at the m-th exposure within the effective irradiation region E0 and the non-interfering region E2 at the (m−1)-th exposure within the effective irradiation region E0 are overlapped on the workpiece W.

As described above, according to the present embodiment, the exposure apparatus 1 exposes the workpiece W with the interfering regions E1 shaped into the rectangular shape being aligned with each other in the substrate conveying direction (i.e., X direction) without overlapping the interfering regions E1. At this moment, instead, according to the present embodiment, the exposure apparatus 1 overlaps the non-interfering regions E2 formed adjacent to the interfering regions E1 each other in the X direction. In other words, the exposure apparatus 1 interposes the non-interfering region E2 between the neighboring interfering regions E1 in the X direction. As shown in the illuminance distribution of the interference fringes in FIG. 5B, the non-interfering region E2 is assumed as a region that serves as the dead zone. Therefore, when the non-interfering region E2 is excessively large, then it entails the deterioration of the product performance. For this reason, when the area of the non-interfering region E2 is "A" and the area of the interfering region E1 is "B", the gap D and the interference angle θ shall be set as appropriate depending on an intended use application such that the dead zone area ratio=[(A/B)*100] (%) is at a value without any problem in practice.

After the workpiece W in the first row is exposed, then the exposure apparatus 1 conveys the workpiece W in the +X direction and +Y direction (namely, downward direction in FIG. 4) and allows the effective irradiation region E0 to be positioned at the left end in the second row. Subsequently, the exposure apparatus 1 conveys the workpiece W in the −X direction (namely, the left direction in FIG. 4) and exposes the workpiece W in the second row while relatively moving the effective irradiation region E0 with respect to the workpiece W. In other words, as to the second row, the exposure apparatus 1 exposes the workpiece W in the second row while moving in the exposure region in turn in the +X direction from the left end position. At this moment, similarly to the exposure in the first row, the exposure apparatus 1 does not cause the interfering regions E1 to be overlapped in the X direction. At this moment, the exposure apparatus 1 does not cause the interfering regions E1 to be overlapped in the Y direction as well. It should be noted that a slight gap may be provided between the neighboring effective irradiation regions E0 (interfering regions E1) in the Y direction.

The above described operation is repeated from an upper end to a lower end of the workpiece W in the Y direction so that the entire workpiece W is exposed as a whole. In this exposure method, the conveying direction of the workpiece W in the exposure in the n-th row differs by 180 degrees from the conveying direction of the workpiece W in the exposure in the (n−1)-th row.

As described above, according to the present embodiment, in the two-beam interference exposure, it makes it possible to shape the interfering region E1 into the rectangular shape, and perform the interference exposure onto a large area of the workpiece W while conveying the substrate (workpiece W) mounted on the stage 11 by stage driving using the step-and-repeat method. As the interfering region E1 is shaped into the rectangular shape, it makes it possible to easily perform the interference exposure onto the large area of the substrate, as shown in FIG. 4.

Figure 6A:
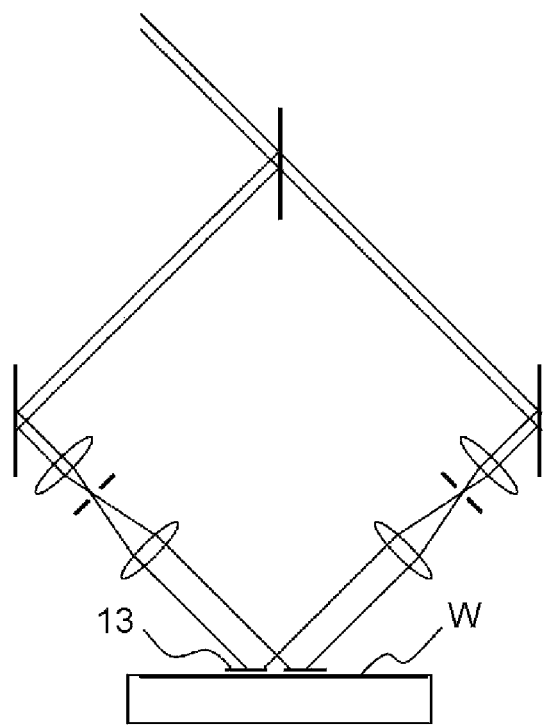
FIG. 6A is a view schematically showing an exemplary configuration of an exposure apparatus according to the first embodiment.
Figure 6B:
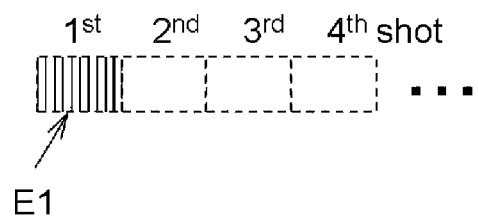
FIG. 6B is a view showing the exposure method according to the first embodiment of the present invention.
Figure 6C:
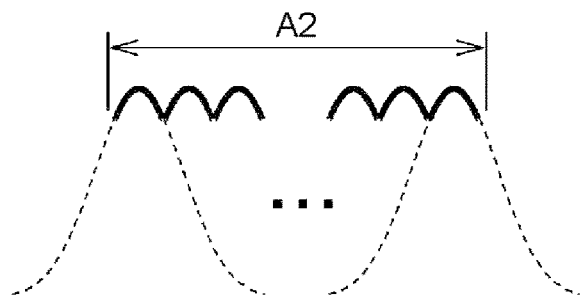
FIG. 6C is a view showing an exemplary exposure illuminance distribution according to the first embodiment of the present invention.

FIG. 6A is a view showing an exemplary configuration of an exposure apparatus according to the present invention. FIG. 6B is a view showing an exposure method according to the present invention. FIG. 6c is a view showing an exemplary illuminance distribution according to the present invention. As shown in FIG. 6A, the mask 13 is provided above the workpiece W, and as shown in FIG. 6B, the interfering region E1 is shaped into the rectangular shape. For this reason, as shown in FIG. 6B, it makes it possible to align the interfering regions E1 in the substrate conveyance direction (i.e., the direction of conveying the substrate) without the interfering regions E1 being overlapped. As a result, it makes it possible to attain a substantially constant illuminance distribution in an effective illuminance region A2, as shown in FIG. 6C.

In the meantime, two-beam interference exposure method may not employ the step-and-repeat method unlike the present embodiment. Hereinafter, the present embodiment and the prior art Patent Literature 1 (Japanese Patent Publication No. 4389791 B) will be explained by comparing each other.

Figure 7A:
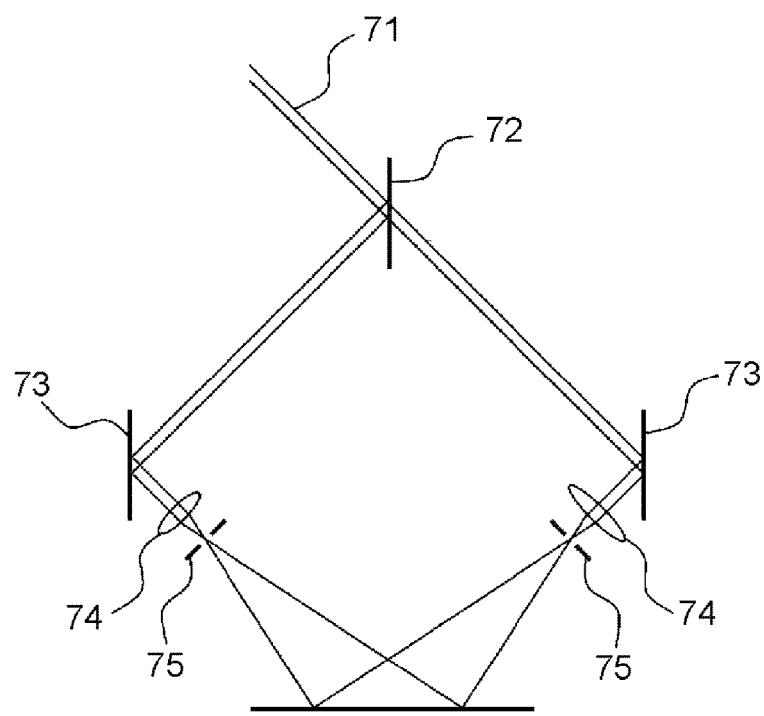
FIG. 7A is a view showing an exemplary configuration of a conventional exposure apparatus.
Figure 7B:
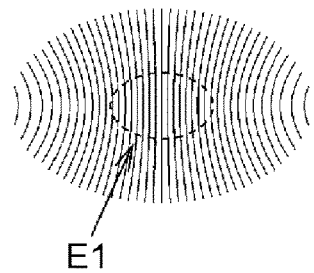
FIG. 7B is a view showing a conventional exposure method.

Namely, in the prior art Patent Literature 1 (Japanese Patent Publication No. 4389791 B), as shown in FIG. 7A, the Gaussian beam 71 is branched into two light beams by the branching element 72, and those branched light beams are deflected by the mirror 73, respectively, and condensed by the light condensing mirror 74. Subsequently, the beam diameter of the light beam is expanded (enlarged) through the pinhole 75 and then the substrate is irradiated with the light beam. However, in this case, as the light beam irradiated onto the substrate has the spherical wave, the interference fringes formed at this time have a state in which an accumulated error of the pitch becomes larger as the interference fringe becomes closer to the edge of the exposure region. Thus, as a result, as shown in FIG. 7B, the interfering stripes shows the hyperbolic curve. In this regard, for a use application requiring equally spaced line patters, it is assumed to be preferable to suppress the accumulated error of the pitch to be equal to or less than one-tenth (10%) of the pitch. Accordingly, as shown in the dashed line in FIG. 7B, it is preferable to limit the interfering region E1 in the vicinity of the center of the beam.

Figure 8A:
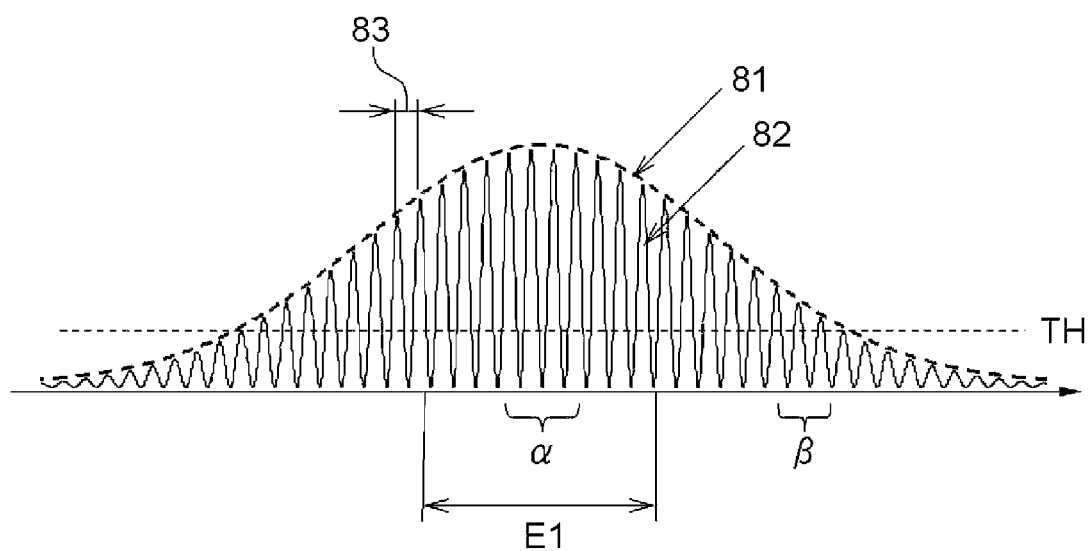
FIG. 8A is a view showing a possible problem entailed by the conventional exposure method.
Figure 8B:
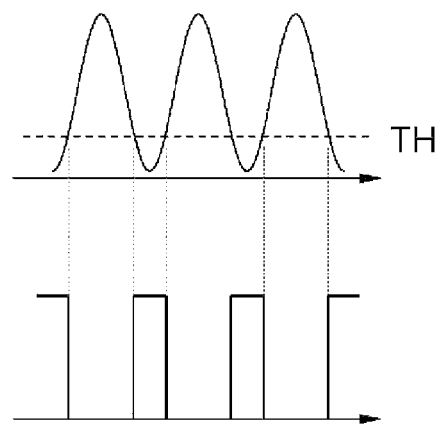
FIG. 8B is a view showing an exemplary illuminance distribution in a region α shown in FIG. 8A.
Figure 8C:
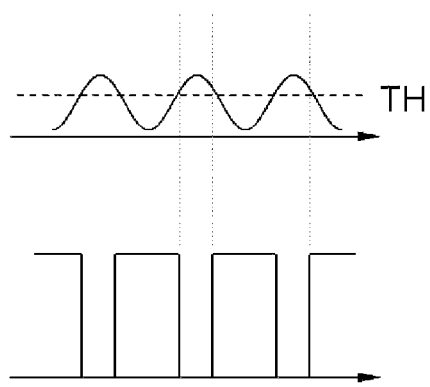
FIG. 8C is a view showing an exemplary illuminance distribution in a region β shown in FIG. 8A.

Also, the Gaussian beam has a tendency, as shown in the illuminance distribution thereof in FIG. 8A, in which the illuminance thereof is being reduced from the center of the beam towards the peripheral part. It should be noted that the broken line 81 in FIG. 8A denotes an envelope curve of the illuminance distribution (i.e., the Gaussian distribution), and the thin line 82 denotes the illuminance distribution of the interference fringes. Likewise, the reference sign 83 in FIG. 8A denotes the interfering pitch (up to 100 nm). For this reason, as shown in an upper part in FIG. 8B, the resist photosensitive threshold TH is relatively at the lower position with respect to the illuminance distribution of the interference fringes in the vicinity of the center of the beam (namely, a region α in FIG. 8A). On the other hand, as shown in an upper part in FIG. 8C, the resist photosensitive threshold TH is relatively at the higher position with respect to the illuminance distribution of the interference fringes in the peripheral part of the beam (namely, a region β in FIG. 8A). As a result, the resist patterns after being developed have different line widths between the center part of the beam and the peripheral part of the beam. For example, as shown in the lower part of FIG. 8B and the lower part in FIG. 8C, respectively, when the resist has the positive type (that is, a part that is exposed to the light dissolves when being developed), the center part of the beam has a thin line width, while the peripheral part of the beam has a thick line width.

As described above, the line widths of the formed patterns differ between the center part of the beam and the peripheral part of the beam. Thus, in order to perform the exposure while suppressing the variation in the line width, it is preferable all the same to limit the interfering region E1 within the vicinity of the center of the beam. More particularly, although it may vary depending on an indented use application, it is preferable in general to limit the interfering region E1 within 10% to 50% of the vicinity of the center of the beam, and more preferably 10% to 30%, further preferably 20%.

Figure 7C:
FIG. 7C is a view showing a conventional exposure illuminance distribution.

When the interfering region E1 is limited in the vicinity of the center of the beam, as shown in FIG. 7C, the effective illuminance region A2 accordingly becomes narrower. Thus, in order to expose a large area of the workpiece W, it is required to enlarge the distance from the spatial filter (i.e., pinhole) to the substrate so that it makes it difficult to downsize the apparatus. More particularly, for example, when the entire area of the 8 inch wafer (=φ200 mm) is to be exposed in one shot with the interfering light that forms the interference fringe with the pitch of 130 nm, assuming λ=248 nm, θ=72 degrees, the light condensing lens NA=0.20, and the effective exposure region of 10%, the accumulated error of the pitch becomes approximately 7.5 μm at the maximum, and the distance from the spatial filter to the substrate is required to be approximately 5100 mm. In addition, as the distance to the substrate becomes longer in this way, it is concerned that an environmental variance may affect more and more. More particularly, as the diffractive index n may vary due to the change in the environmental temperature, it is concerned that the pitch of the interference fringes varies so as to entail an exposure defect or error.

In contrast, according to the present embodiment, as described above, by employing the step-and-repeat method, the workpiece W is exposed in a unit of a small segment while the substrate being conveyed by stage driving. For this reason, it makes it possible to set the distance from the optical system to the substrate to be shorter, and expose the large area of the workpiece W without the apparatus being large sized. Also, it is unlikely that the environmental variation affects the exposing operation.

Figure 9A:
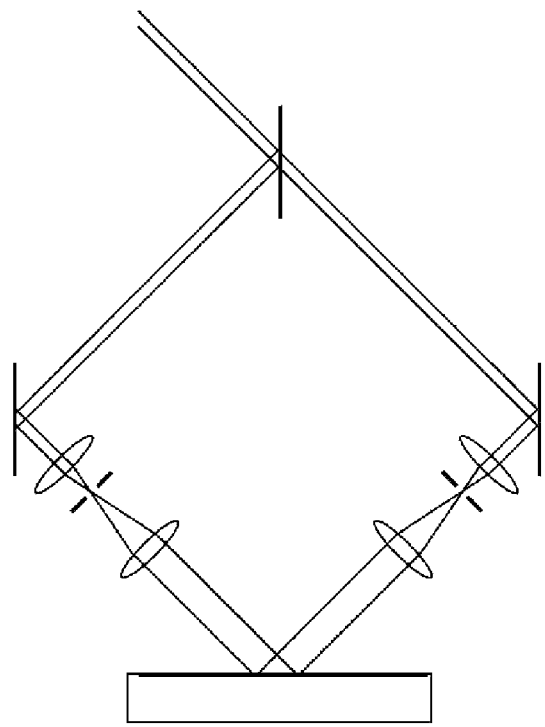
FIG. 9A is a view showing an exemplary configuration of the conventional exposure apparatus.

Next, as the other example, hereinafter, the present embodiment and the prior art Patent Literature 2 (Japanese Patent Publication No. 4514317 B) will be explained in a comparative manner. FIG. 9A is a view showing a mode disclosed in the prior art Patent Literature 2 (Japanese Patent Publication No. 4514317 B). This disclose has, in the two-beam interference exposure method employing the step-and-repeat method, a device configuration in which the exposure region is not shaped into the rectangular shape with the mask 13, unlike the present embodiment.

Figure 9B:
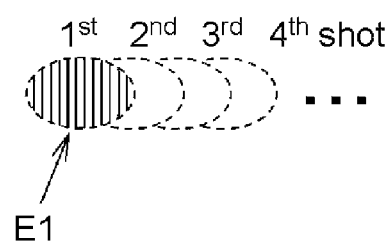
FIG. 9B is a view showing a conventional exposure method.
Figure 9C:
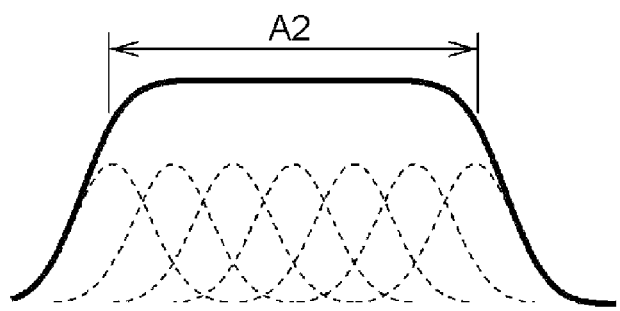
FIG. 9C is a view showing a conventional exposure illuminance distribution.

More particularly, in this case, as shown in FIG. 9C, in order to obtain a constant (or certain level of) illuminance distribution in the effective illuminance region A2, the exposure method is required to overlap the interfering regions E1 each other in the substrate conveyance direction, as shown in FIG. 9B. At this moment, it is required to reduce an irradiation energy in each exposure operation depending on the number of overlapping. For this reason, when the interfering region E1 is assumed to be similar to the one in the present embodiment, then the number of shots onto the substrate increases depending on the number of the overlapping as compared to the case in the present embodiment in which the exposure region is shaped into the rectangular shape. Thus, it increases the travel distance of the substrate in total in the X direction and the Y direction. In addition, the number of settling itself also increases for settling the substrate to be arranged at a predetermined position (in other words, to be in a state that there is no stage vibration or the like) so that the throughput is lowered.

In the meantime, in order to overlap the interfering light beams, the pitch of the interference fringes is required to be stable. In this regard, in the two-beam interference exposure, the disturbance in the wave surface of the interfering light beam causes the pitch error to increase. For this reason, the interference fringes transcribed onto the substrate is not a perfect straight line but has a shape of the above described hyperbolic curve or a wavy or rippling shape. As a result, to overlap the interfering light beams becomes impossible in principle, in a state that the pitch error is equal to or greater than the dimension of the interference (or interfering) pitch. In order to cope with this problem, the interfering light beam is required to have an ideal plane wave. However, on the other hand, as the lens has in general the aberration, it is required to narrow down the beam diameter and use solely the light beam in the center part of the lens in order to obtain the ideal plane wave. In other words, it is required to reduce the effective exposure region. It causes the number of shots to increase so as to reduce the throughput. On the other hand, in order to obtain the ideal plane wave having a large diameter, it is conceivable to use a lens with a low NA and a long focal point distance, or to use a high precision lens of which aberration is corrected. However, it makes it difficult in terms of a complicated device design, a higher manufacturing cost, and a complicated optical element design or the like.

In addition, in order to overlap the interfering light beams, it is required to scan control the interference fringes such that the interference fringes are pieced one another. In this case, the stage used for conveying the substrate is required to have an extremely high positioning accuracy, which is capable of being controlled with an accuracy similar to the one of the interfering pitch, in order not to cause the defect, such as non-overlapping between the lines of the interference fringes. In other words, in order to perform the overlapping exposure with a fine interfering pitch, the stage is required to have the stability in stopping and the repetitive accuracy in the order of sub-micron to nm so that it makes it difficult to control.

In contrast, according to the present embodiment, the mask 13 having the rectangular opening is used to shape the interfering region E1 into the rectangular shape. For this reason, using the step-and-repeat method, it makes it possible to align the interfering regions E1 with each other in the substrate conveyance direction without the interfering regions E1 being overlapped. Accordingly, it makes it possible to reduce the number of shots onto the substrate as compared to the conventional method in which the interfering regions E1 are overlapped each other as shown in the exposure method in FIGS. 9A to 9C. As a result, it makes it possible to reduce the exposure time for exposing the entire substrate as a whole so as to improve the throughput.

For example, when the substrate size is 8 inches and the interfering region E1 is 20.5 mm×13.8 mm, according to the present embodiment in which the interfering regions E1 are not overlapped, the number of shots is 88 times. On the other hand, according to the conventional exposure method shown in FIGS. 9A to 9C in which the interfering regions E1 are overlapped in the X direction and also the Y direction when the substrate size and the area of the interfering region is the same as the present embodiment, assuming the number of overlapping in the X direction and the Y direction is twice (that means that the energy required to expose a certain point is divided into two shots), then the number of shots onto the substrate reaches 352 times.

Furthermore, according to the present embodiment, as the interfering regions E1 are not overlapped each other, the patterns of the interference fringes are not required to have a high accuracy. This is because, even if the ideal plane wave is not obtainable and the pitch error is equal to or greater than the dimension of the interfering pitch, still it is not required to overlap the interference stripes each other so that the principled constrain is not imposed. As a result, for a certain use application that permits the pitch error to a certain extent, the effective exposure region may be enlarged. Thus, it makes it possible to reduce the number of shots so as to improve the throughput. Needless to say, additionally or alternatively, for another use application that cannot permit the pitch error, an optical system that is capable of obtaining the ideal plane wave may be employed.

Yet furthermore, according to the present embodiment, as the interfering regions E1 are not overlapped each other, the stage for conveying the substrate is not required to have a high positioning accuracy that much. In other words, it makes it possible to suppress the cost necessitated for constructing the control system. More particularly, the positioning accuracy required for the stage for conveying the substrate may be permissible to be equal to or greater than 0.5 µm. However, when the positioning accuracy is too low, then it causes the area ratio of the dead zone to increase. In light of this observation, it is desirable for the positioning accuracy to be equal to or less than 5 µm.

As described above, according to the present embodiment, as the step-and-repeat method is employed in the two-beam interference exposure, it makes it possible to expose a large are of the workpiece W without the apparatus being large sized. As a result, it makes it possible to reduce the cost associated with the large sizing of the apparatus.

Yet furthermore, according to the present embodiment, as the interfering region onto which the interfering light is irradiated is shaped into the rectangular shape, it makes it possible to perform the exposure by the step-and-repeat method without the interfering regions being overlapped in the substrate conveyance direction. As a result, it makes it possible to reduce the number of shots onto the substrate, as compared to the conventional method in which the interfering regions are overlapped, so as to improve the throughput.

As described above, according to the present invention, it makes it possible to implement the fine processing (micro fabrication) onto the workpiece W with the higher throughput yet the lower cost.

Yet furthermore, as the non-interfering regions are formed at the both sides of the interfering region in the substrate conveying direction, and the formed non-interfering regions are then used for the overlapping when the substrate is conveyed, it makes it possible to prevent the workpiece W from excessively exposed (i.e., overexposure) due to the interfering regions being overlapped. At the same time, the non-interfering region is usable for an index or a reference to arrange the interfering regions to be aligned with each other. Therefore, it makes it possible to expose the substrate more easily and appropriately.

Yet furthermore, according the present embodiment, as the mask 13, which serves as the light shielding member having the light transmissive part of the rectangular shape, is arranged above the substrate, it makes it possible to shape the interfering region into the rectangular shape relatively easily. In addition, at this moment, as the gap D is provided between the substrate and the mask 13, it makes it possible to prevent the particles or the like from attaching due to the substrate and the mask 13 sticking together.

The above mentioned exposure method can be applied to a method for fabricating, for example, the Fiber Bragg Grating (hereinafter referred to as "FBG").

Figure 10A:
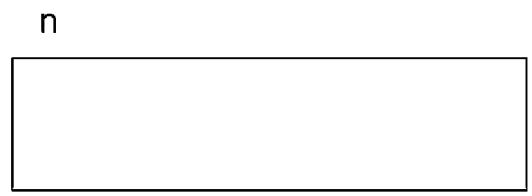
FIG. 10A is a view showing an exemplary fabrication method of a structure having a periodic variance in a physical property thereof (before exposure)
Figure 10B:
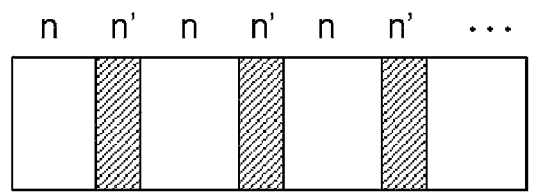
FIG. 10B is a view showing an exemplary fabrication method of a structure having a periodic variance in a physical property thereof (after exposure)

The FBG is a certain type of the light fiber sensor and is used for measuring the temperature or the distortion. The FBG has a periodic structure of the refractive indexes formed on the optical fiber or the like, and, as shown in FIG. 10B, has a state in which a refractive index n is aligned with a refractive index n' that differs from the refractive index n in turn. This structure has a nature that allows, out of the light propagating in the optical fiber, solely light having a specified wavelength to reflect and also allows light having a wavelength other than the specified wavelength to transmit. Also, the reflecting wavelength λb depends on the cycle Λ of the refractive index and an effective refractive index ne of the optical fiber, therefore the relationship below is established:

$$\lambda b = 2 \cdot ne \cdot \Lambda$$

Accordingly, when the change in the periodic structure occurs due to the temperature change or the distortion or the like, it is possible to measure the temperature or the distortion or the like as a modulation or alternation of the wavelength of the light propagating in the optical fiber. Thus, it makes it possible for the FBG to be used as a temperature sensor or a distortion sensor or the like.

In order to fabricate the periodic structure of the refractive index such as the FBG, a photosensitive material may be irradiated with the light in which that has the intensity being periodically distributed. FIG. 10A shows the optical fiber before being exposed to the light, and FIG. 10B shows the refractive index distribution of the optical fiber after being exposed to the light, respectively. The two-beam interference exposure is suitable for the method for fabricating this kind of periodic structure. According to the present embodiment, as the large area of the workpiece W can be exposed with the higher throughput, it makes it possible to perform the high speed processing to a plurality of fibers when fabricating the FBG.

As described above, when fabricating the FBG, the method that imparts the physical property corresponding to the interference fringe. However, alternatively, a method for forming a pattern (or shape) corresponding to the interference fringe may be also conceivable for the other use application. For example, a method is conceivable that uses the laser ablation by the high output power pulse laser to directly fabricate the interference fringes on the substrate. Also, another method is conceivable that exposes a light curing resin to be cured, and obtains a microstructure corresponding to the interference fringes. Those methods can be applied to the surface modification of the substrate or the photonic crystal fabrication or the like.

In this regard, according to the present embodiment, by employing the two-beam interference exposure, it is possible to expose the large area of the workpiece W with the higher throughput. As a result, the surface modification of a large area workpiece or the high speed fabrication of the photonic crystal can be performed.

Yet furthermore, the above mentioned exposure method may be applied to, for example, a method for a grid polarizing element (polarizer). Namely, various kinds of polarizing element for obtaining polarized light has been known as a polarizing element such as a polarization filter or a polarizing film or the like including a familiar product such as polarized sunglasses, and also used in a display device such as a liquid crystal display or the like. The polarizing elements fall into several categories according to a method for extracting the polarized light. Amongst those, the wire grid polarizing element is known.

The wire grid polarizing element has a structure in which a fine striped grid made of metal such as aluminum is disposed on a transparent substrate. The wire grid polarizing element functions as the polarizing element by setting a clearance interval between linear members constituting the grid (i.e., a grid interval) to be equal to or less than the wavelength of the light to be polarized. Out of the linearly polarized light, the polarized light having an electric field component in the longitudinal direction of the grid is reflected by the wire grid polarizing element as the wire grid polarizing element is equivalent to flat metal, while the other polarized light having an electric field component in the direction vertical to the longitudinal direction transmits the transparent substrate to be irradiated outside as the wire grid polarizing element is equivalent to the transparent substrate being only provided. For this reason, the linear polarized light having the electric field component in the direction vertical to the longitudinal direction of the grid sire is exclusively emitted from the polarizing element. By controlling the posture of the polarizing element to allow the longitudinal direction of the grid to be directed to the desired direction, it is assumed that the polarized light of which axis (that is, a direction of the electric field component) is directed to the desired direction can be obtained.

Hereinafter and throughout the specification, for the sake of the simplified explanation, the linear polarized light having the electric field component in the longitudinal direction of the grid is referred to as "s-polarized light", while the linear polarized light having the electric field component in the direction vertical to the longitudinal direction of the grid is referred to as "p-polarized light". In this regard, in general, the s-wave denotes the one having the electric field vertical to an incidence plane (that is, a plane vertical to the reflecting plane and containing incident light beam and reflected light beam), while the p-wave denotes the one having the electric field parallel to the incidence plane. Nevertheless, presuming that the longitudinal direction of the grid is parallel to the incidence plane as premise, the above differentiation will be used.

A fundamental indexes indicating a performance of the above mentioned polarizing element are the extinction ratio ER and the light transmissivity (light transmission ratio) TR. The extinction ratio ER is, out of the intensity of the polarized light that has transmitted through the polarizing element, the proportion of the intensity of the p-polarized light (Ip) with respect to the intensity of the s-polarized light (Is) (Ip/Is). Also, the light transmission ratio TR is, in general, the proportion of the energy of the emitted p-polarized light with respect to all the energy of incident p-polarized light and also s-polarized light (TR=Ip/(Is+Ip)). The ideal polarizing element is assumed to have the extinction ratio ER=∞ and the transmission ratio TR=50%.

It should be noted, although in general the polarizing element having a grid made of metal is referred to as a "wire gird polarizing element", hereinafter and throughout the specification, both of the polarizing element having a grid made of the metal and the polarizing element having a grid made of non-metal are simply and collectively referred to as the "grid polarizing element".

FIGS. 11A to 11E are views schematically showing a method for fabricating the grid polarizing element.

Figure 11A:
FIG. 11A is a view showing an exemplary fabrication method of a grid polarizing element.
Figure 11B:
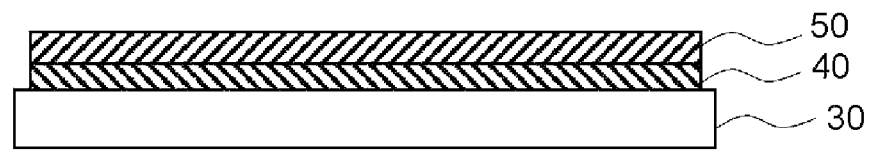
FIG. 11B is a view showing an exemplary fabrication method of the grid polarizing element.

First, as shown in FIG. 11A, a thin film 40 for the grid is fabricated on a transparent substrate 30. Here, the material of the thin film 40 for the grid may be, for example, an inorganic dielectric body (or substance). Next, as shown in FIG. 11B, a photoresist 50 is coated (applied) onto the thin film 40 for the grid.

Figure 11C:
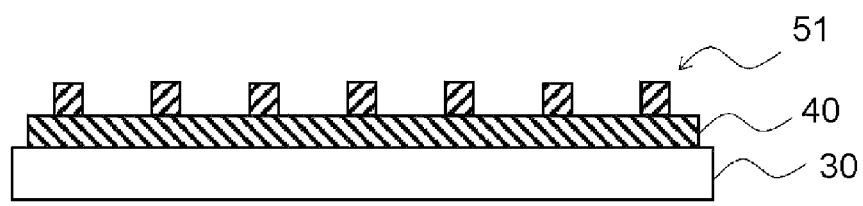
FIG. 11C is a view showing an exemplary fabrication method of the grid polarizing element.

Subsequently, in this state, the photoresist 50 is exposed according to the exposure method of the present embodiment, and then developed. Thus, as shown in FIG. 11C, a resist pattern 51 of the photoresist is obtained. This resist pattern 51 is of the grid shape.

Figure 11D:
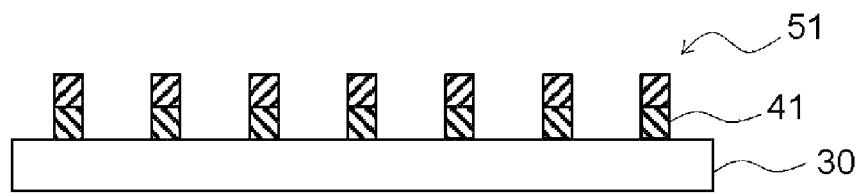
FIG. 11D is a view showing an exemplary fabrication method of the grid polarizing element.

Yet subsequently, an etchant is supplied from the side of the resist pattern 51 to etch a part of the thin film 40 for the grid that is not covered by the resist pattern 51. The etching employed is the anisotropic etching that is performed while applying the electric field in the thickness direction of the thin film 40 for the grid. Accordingly, as shown in FIG. 11D, the thin film 40 for the grid is patterned and a pattern 41 is obtained.

Figure 11E:
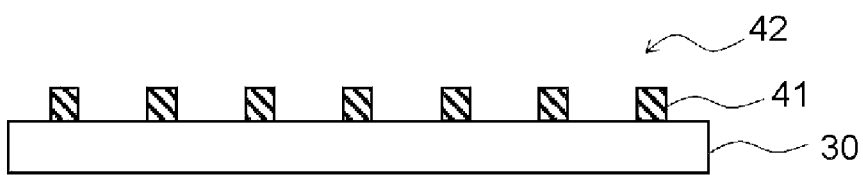
FIG. 11E is a view showing an exemplary fabrication method of the grid polarizing element.

Lastly, as shown in FIG. 11E, the resist pattern 51 is removed. As a result, a grid 42 is obtained and therefor the grid polarizing element is completed. The grid 42 is also frequently referred to as the "line-and-space", as the grid 42 has a structure in which numerous patterns extending in a given direction are arranged in parallel at intervals.

As shown in FIG. 5, which has been already addressed, when the neighboring non-interfering regions E2 in the effective irradiation region E0 are overlapped each other in the substrate conveying direction, non-interfering region E2 is interposed between the neighboring interfering regions E1 in the substrate conveying direction. When the non-interfering region E2, which is a region serving as the dead zone, is excessively large, then it entails the defect that, for example, the extinction ratio (ER) is lowered, which is an index of the polarizing performance in the grid polarizing element. For this reason, in order to attain the extinction ratio at a level without any problems in practice for the grid polarizing element, the area ratio of the dead zone is required to be set as appropriate depending on an intended use application.

Hereinafter, the area ratio of the dead zone will be discussed.

Figure 12:
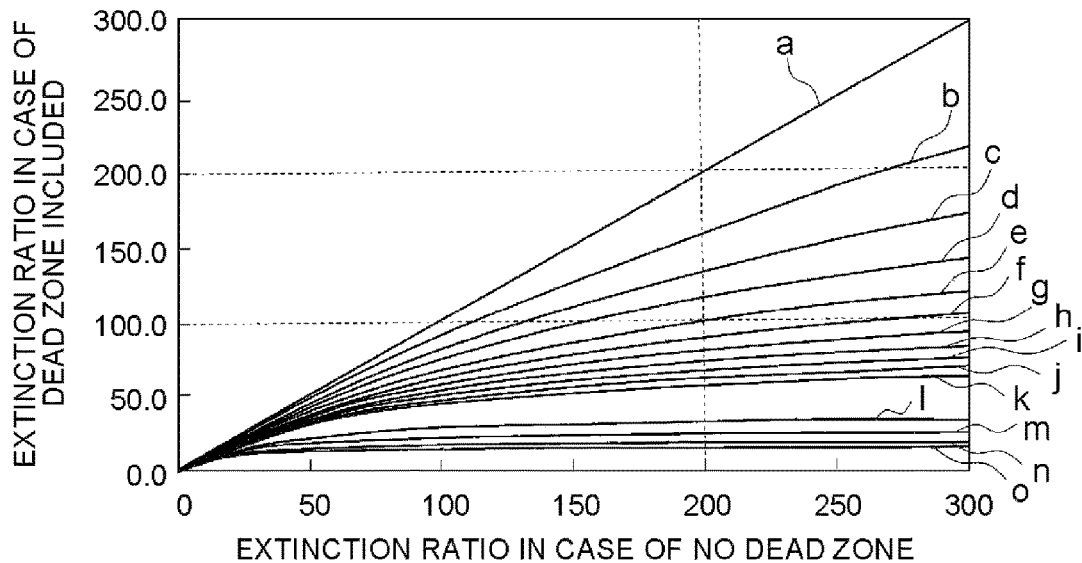
FIG. 12 is a view showing an exemplary relationship between an area ratio and the extinction ratio of the non-interfering light irradiation region (i.e., dead zone)

FIG. 12 is a graph showing the transition of the extinction ratio in the case that the horizontal axis denotes the extinction ratio without the dead zone and the vertical axis denotes the extinction ratio with the dead zone being included. Here, the size of one shot is 20.5 mm×13.8 mm, and the transmission ratio is 40% in any cases.

In FIG. 12, the transition of the extinction ratio is shown in which the reference sign a denotes the dead zone area ratio of 0%, the reference sign b denotes the area ratio of 0.1%, the reference sign c denotes the area ratio of 0.2%, the reference sign d denotes the area ratio of 0.3%, the reference sign e denotes the area ratio of 0.4%, the reference sign f denotes the area ratio of 0.5%, the reference sign g denotes the area ratio of 0.6%, the reference sign h denotes the area ratio of 0.7%, the reference sign i denotes the area ratio of 0.8%, the reference sign j denotes the area ratio of 0.9%, the reference sign k denotes the area ratio of 1.0%, the reference sign l denotes the area ratio of 2.0%, the reference sign m denotes the area ratio of 3.0%, the reference sign n denotes the area ratio of 4.0%, and the reference sign o denotes the area ratio of 5.0%.

As also apparent from FIG. 12, when the area ratio of the dead zone is 0%, then the extinction ratio ER becomes 200, and when the area ratio is 0.4%, the extinction ratio is lowered down to approximately 100.

Figure 13:
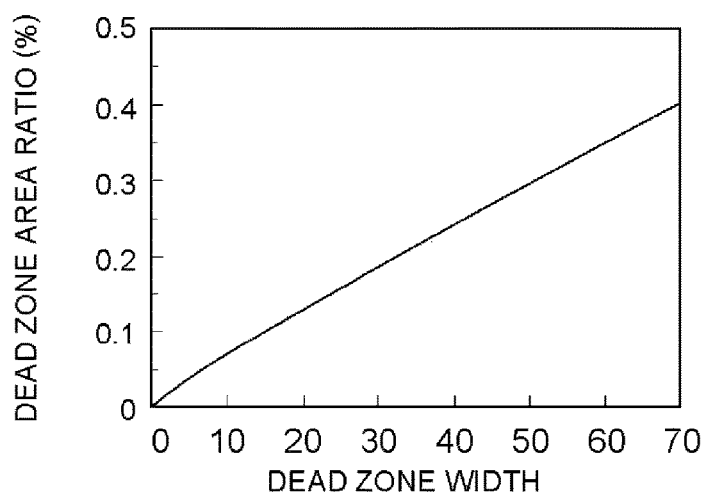
FIG. 13 is a view showing an exemplary relationship between a dead zone width and a dead zone area ratio.

Furthermore, FIG. 13 is a view showing the relationship between the dead zone width and the dead zone area ratio where the interfering angle θ is 15 to 60 degree, the gap D is 0 to 20 μm, and the dead zone width (non-interfering region) 2D·tan θ being varied within the range of 0 to 70 μm. In FIG. 13, the horizontal axis denotes the dead zone width and the vertical axis denotes the dead zone area ratio. As shown in FIG. 13, when the dead zone width is set 0 to 70 μm, then the dead zone area ratio becomes 0% to 0.4%.

Taking the above observation into consideration, it is turned out that the extinction ratio of the grid polarizing element can be equal to or greater than 100, when the interfering angle θ is 15 degrees to 60 degrees, the dead zone (non-interfering region) width is 0 to 70 μm, and the dead zone area ratio is less than 0.4%.

In general, it is assumed that the extinction ratio at the level without any problem in practice is equal to or greater than 100. Accordingly, it is turned out that the dead zone area ratio (=(A/B)*100) is to be less than 0.4%, where the area of the non-interfering region is A, and the area of the interfering region is B.

Second Embodiment

Hereinafter, a second embodiment of the present invention will be described below in detail.

In the above mentioned first embodiment, when the effective irradiation regions E0 are aligned with one another in the substrate conveying direction, the interfering regions E1 are not overlapped each other but the non-interfering regions E2 are overlapped each other. On the other hand, according to the second embodiment, the non-interfering region E2 is overlapped with the neighboring interfering region E1.

FIG. 14 is a view showing an exposure method according to the second embodiment.

Figures 14A, 14B:
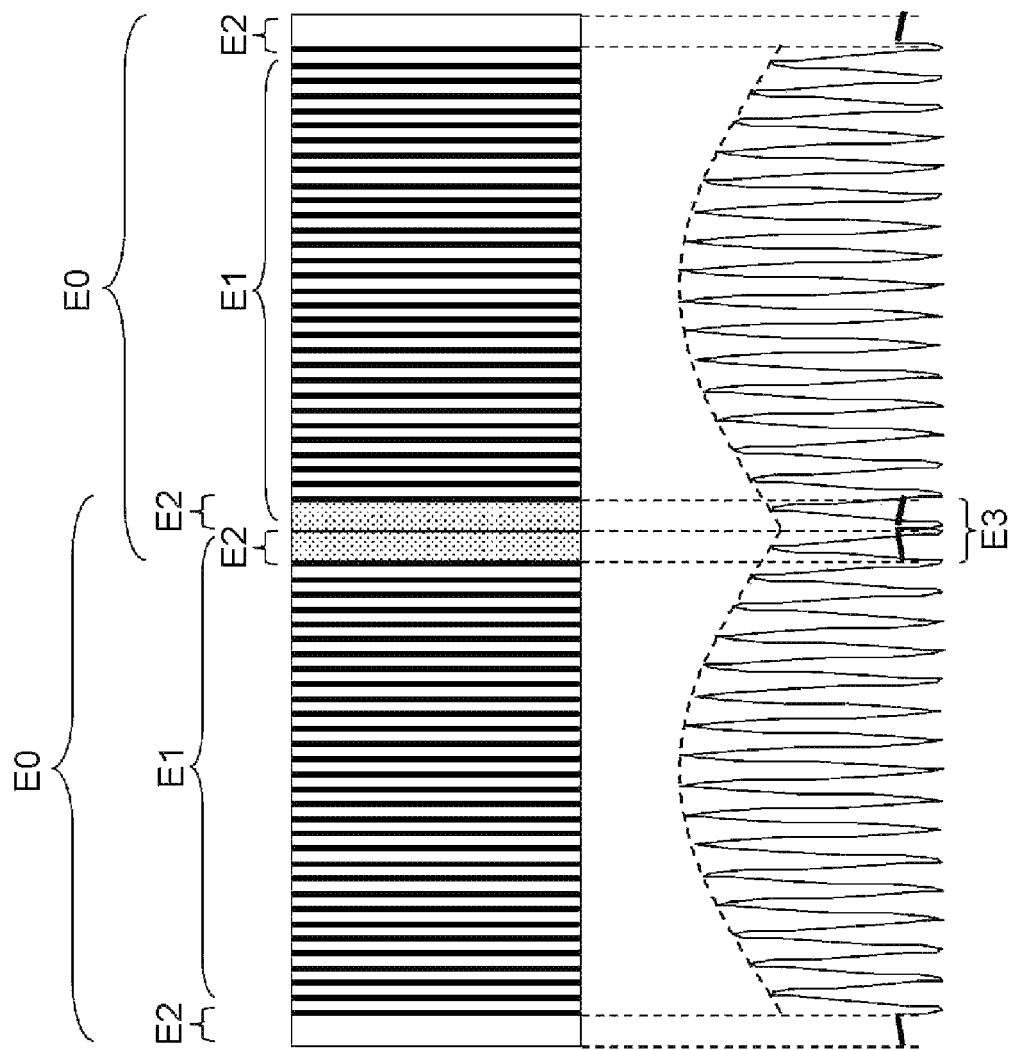
FIG. 14A is a view showing an exposure method according to a second embodiment of the present invention.
FIG. 14B is a view showing an exposure method according to a second embodiment of the present invention.

As shown in FIG. 14A, the exposure apparatus 1 conveys the work W so as not to overlap the interfering region E1 in the effective irradiation region E0 at m-th exposure and the interfering region E1 in the effective irradiation region E0 at (m−1)-th exposure. Furthermore, according to the second embodiment, the exposure apparatus 1 conveys the work W so as to overlap the interfering region E1 in the effective irradiation region E0 at m-th exposure and the non-interfering region E2 in the effective irradiation region E0 at (m−1)-th exposure, and also to overlap the non-interfering region E2 in the effective irradiation region E0 at the m-th exposure and the interfering region E1 in the effective irradiation region E0 at (m−1)-th exposure.

In this case, as shown in the illuminance distribution of the interference fringes in FIG. 14B, a pattern is formed in a region E3 in which the interfering region E1 and the non-interfering region E2 are overlapped each other depending on the conditions such as the resist photosensitive threshold or the illuminance distribution.

In the second embodiment, similarly to the above mentioned first embodiment, the respective interfering regions E1 in the neighboring effective irradiation regions E0 in the substrate conveying direction are not overlapped. For this reason, it makes it possible to reduce the number of shots so as to improve the throughput, as compared to the conventional exposure method shown in FIGS. 9A to 9C in which the interfering regions E1 are overlapped.

Furthermore, according to the second embodiment, it is possible to reduce the dead zone as compared to the above mentioned first embodiment so that the product performance can be assured.

It should be noted that in some cases the non-interfering region E2 may be interposed between the neighboring interfering regions E1 in the substrate conveying direction. As the non-interfering region E2 serves as the dead zone, it is preferable to make the non-interfering region E2 be as small as possible particularly for a certain use application in which the existence of the dead zone is considered to be problematic.

Third Embodiment

Next, hereinafter, a third embodiment of the present invention will be described below in detail.

In the above mentioned first and second embodiments, the mask 13 is arranged above the workpiece W with the gap D being provided. On the other hand, according to the third embodiment, the mask 13 is arranged directly on the workpiece W without the gap D being provided.

In the third embodiment, the exposure apparatus 1 performs the exposure in a state that the mask 13 is contacting the workpiece W. In this case, as the light beam is not wrapped around unlike those shown in FIG. 2, the non-interfering region E2 is not formed at both edges of the interfering region E1. In other words, the area of the effective irradiation region E0 is become equal to the area of the interfering region E1.

When exposing by the step-and-repeat method, as shown in FIG. 15, the exposure is to be performed so as not to overlap the neighboring interfering regions E1 (=the effective irradiation region E0) in the substrate conveying direction each other. At this moment, a little gap may be provided between the neighboring interfering regions E1. It should be noted the gap serves as the dead zone. For this reason, it is preferable to make the gap be as small as possible for a certain use application in which the existence of the dead zone is considered as problematic.

As described above, as the mask 13 is arranged in a state that the mask 13 is contacting the workpiece W, it makes it possible to broaden the effective exposure region by an area of non-interfering region E2 as compared to the above mentioned first and second embodiment. As a result, it makes it possible to reduce the number of shots accordingly so as to improve the throughput.

Fourth Embodiment

Next, hereinafter, a fourth embodiment of the present invention will be described below in detail.

In the above mentioned first to third embodiments, the interfering light is irradiated such that the interference fringe of the stripe shape is formed on the substrate. On the other hand, according to the fourth embodiment, the interfering light is irradiated such that the interference fringe of a grid shape is formed on the substrate.

Figure 16A:
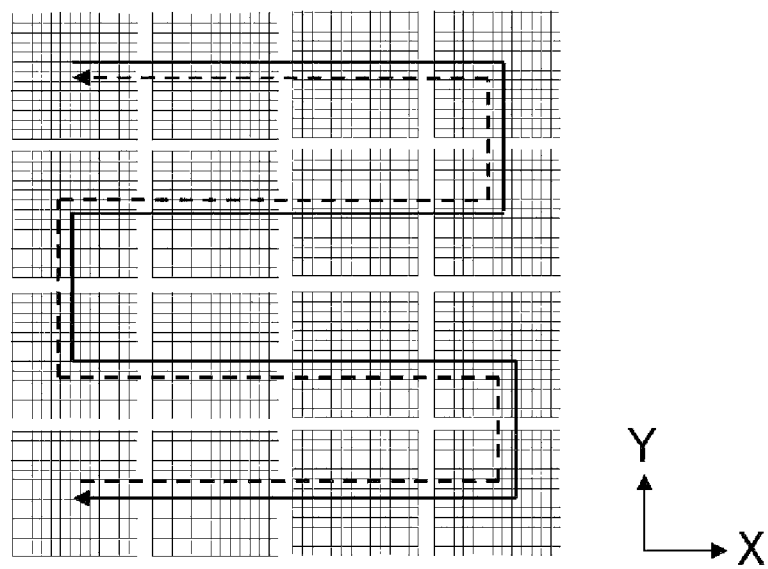
FIG. 16A is a view showing an exposure method according to a fourth embodiment of the present invention.

According to the forth embodiment, as shown in FIG. 16A, the exposure apparatus 1 irradiate the substrate with the interfering light both on an outward path (shown in the solid arrow) and a return path (shown in the dashed arrow), respectively.

Figure 16B:
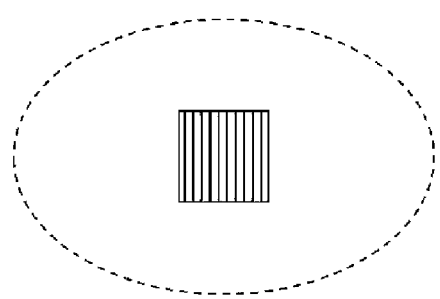
FIG. 16B is a view showing an exemplary interference fringes of the interfering light radiated in an outward direction.

More particularly, on the outward path, the exposure apparatus 1 irradiates, similarly to the first to third embodiments, the entire substrate as a whole with the interfering light so as to form the interference fringe of the stripe shape extending in the Y direction (as shown in FIG. 16B). The interfering light irradiated onto the substrate on the outward path is referred to as a "first interfering light".

Figure 16C:
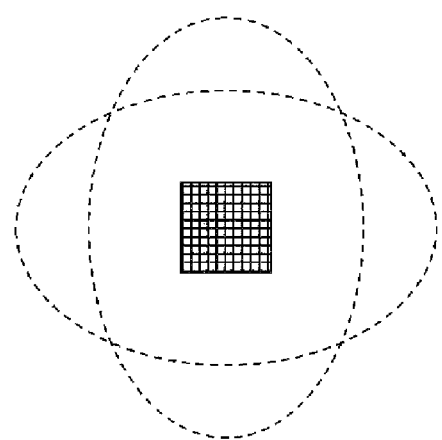
FIG. 16C is a view showing an exemplary interference fringes of the interfering light radiated in a return direction.

Subsequently, on the return path, the exposure apparatus 1 rotates by 90 degrees the interfering light, which has been irradiated on the outward path for forming the interference fringe of the stripe shape, and then irradiates the interfering light so as to form the interfering light of the stripe shape extending basically in the X direction (as shown in FIG. 16C). The interfering light irradiated onto the substrate on the return path is referred to as a "second interfering light".

In this way, apart irradiated with the first interfering light and the second interfering light in an overlapped manner is assumed to be irradiated so as to form the interfering fringe of the grid shape.

Hereinafter, an exposure method according to the present embodiment will be described below in more detail.

On the outward path, the exposure apparatus 1 irradiate the substrate with the first interfering light according to the same way as the exposure method of the first to third embodiments. Namely, on the return path, as shown in FIG. 16A, the exposure apparatus 1 irradiate the substrate in the n-th row with the second interfering light while conveying the substrate in the −X direction, assuming that +X direction is the substrate conveying direction when irradiating the substrate in the last row (n-th row) on the outward path. Subsequently, in the case that the substrate is in turn conveyed in the +Y direction on the outward path, after finishing the irradiation onto the substrate in n-th row, the exposure apparatus 1 conveys the substrate in the −Y direction and starts to irradiate the substrate in (n−1)-th row with the second interfering light. At this moment, the exposure apparatus 1 irradiate the substrate in the (n−1)-th row with the second interfering light while conveying the substrate in the +X direction (that is, an opposite direction by 180 degrees to the outward path). The exposure apparatus 1 irradiates the substrate in the (n−1)-th row as well with the interfering light that is rotated by 90 degrees with respect to the interfering light irradiated on the outward path.

By repeating the above mentioned operations, it makes it possible to irradiate the substrate with the interfering light so as to form the interference fringe of the grid shape on the entire surface of the substrate. For example, when a photosensitive material film applied onto the substrate (for example, a resist or the like) is the positive type in which a light irradiated portion is dissolved in a developing solution, by exposing by use of the above mentioned exposure method, it makes is possible to form a pattern in which the light irradiated portion of the grid shape is dissolved and a circular cylinder, a prismatic column, a circular cone, or a pyramid or the like remains.

On the other hand, when the photosensitive material film applied onto the substrate is the negative type in which a light irradiated portion is crosslinked so as not to dissolve in the developing solution, by exposing by use of the above mentioned exposure method, it makes it possible to form a pattern in which the light irradiated portion of the grid shape remains and a concave portion of a squared or round shape is provided.

As described above, according to the fourth embodiment, it makes it possible to easily form the pattern of the grid shape on the substrate.

Figure 17:
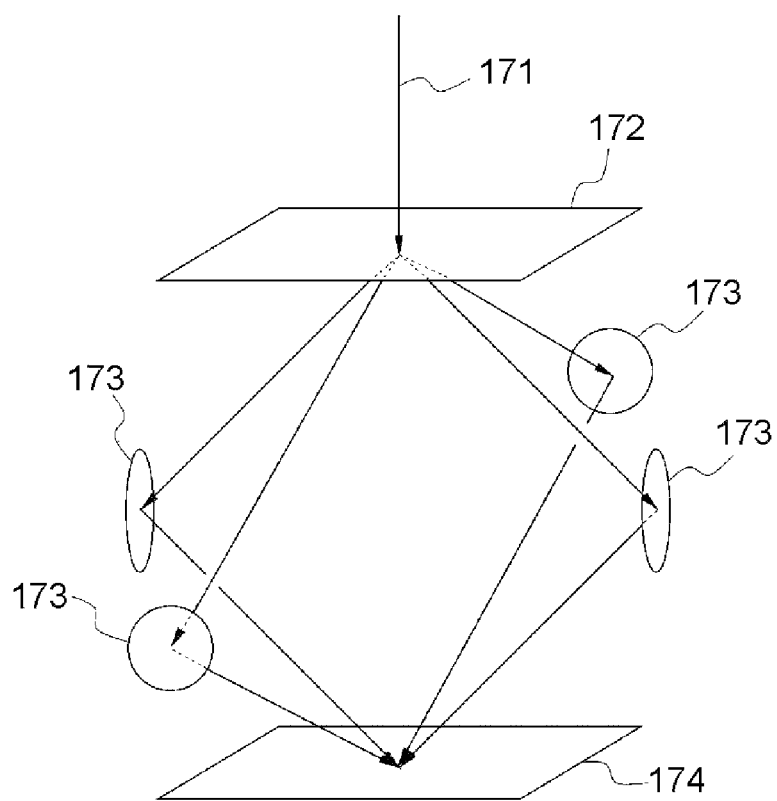
FIG. 17 is a view schematically showing a multi beam interference exposure method according to the present embodiments of the present invention.

In order to obtain the above mentioned pattern of the grid shape, the method for branching the exposure light beam may be varied. More particularly, the light beam may be branched into two or more light beams, and the branched light beams may be irradiated onto the substrate at one time. This kind of method is referred to as the "multi-beam interference exposure". As means for branching, for example, as shown in FIG. 17, a diffractive optical element may be used as a branching element 172 which branches the laser 171 into a multiple beams. In the multi-beam interference exposure, in order to attain the similar result to the above mentioned method for overlapping two interfering light beams by rotating by 90 degrees, the light beam may be branched into four light beams, and an optical part (e.g., a mirror 173) may be arranged such that four planes constituted by the branched four light beams and the normal line of the substrate 172 are oriented by 90 degrees, respectively, and also an angle between two opposing branched light beams becomes a predetermined interfering angle when entering the substrate, as shown in FIG. 17.

Fifth Embodiment

Next, hereinafter, a fifth embodiment of the present invention will be described below in detail.

In the above mentioned first to fourth embodiments, each of the reflecting mirrors 7a and 7b is a fixed mirror. On the other hand, according to the fifth embodiment, each of the reflecting mirrors 7a and 7b is an angle variable mirror.

Figure 18:
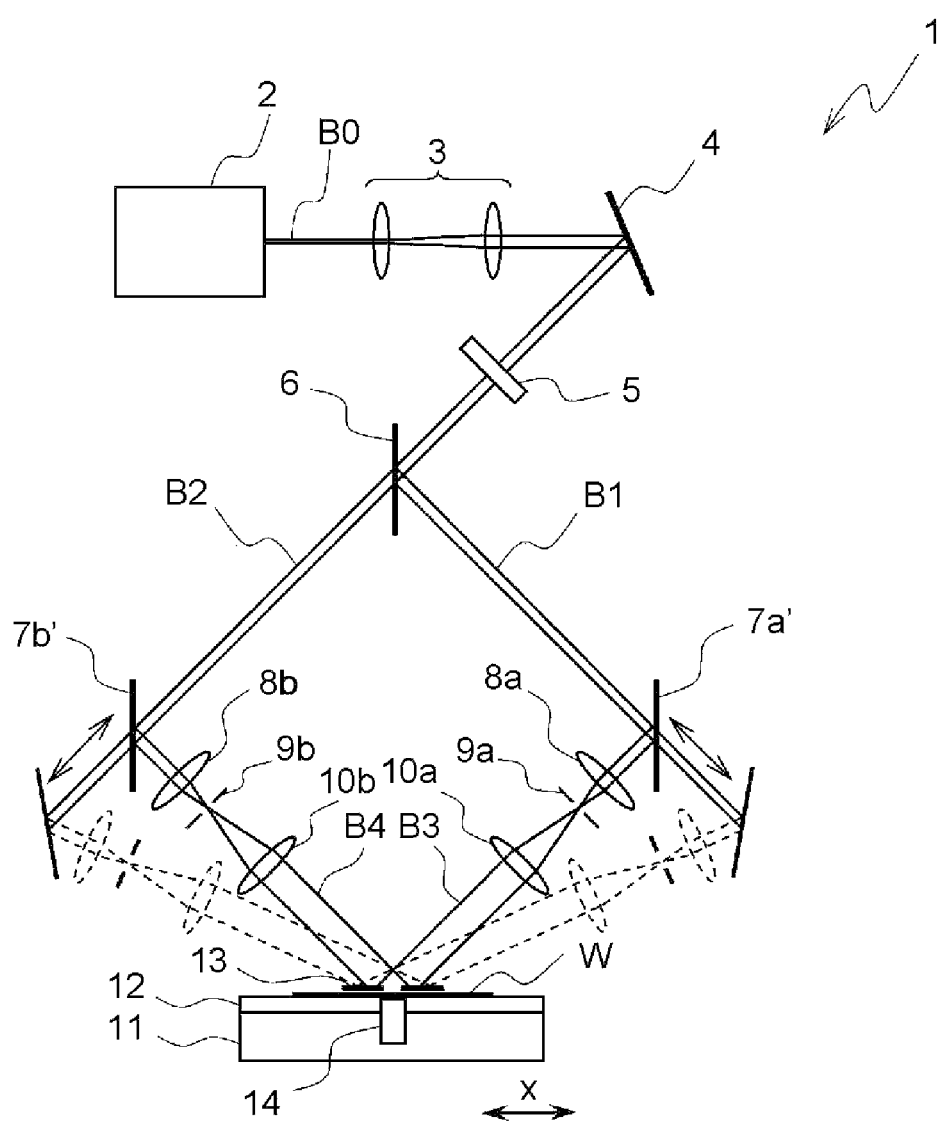
FIG. 18 is a view showing an exemplary exposure apparatus according to a fifth embodiment of the present invention.

FIG. 18 is a view schematically showing an exemplary configuration of an exposure apparatus according to the fifth embodiment.

The exposure apparatus 1 has a similar configuration to the exposure apparatus shown in FIG. 1 except for the reflecting mirrors 7a and 7b being replaced with angle variable mirrors 7a' and 7b'. Thus, in FIG. 18, components having the same or similar configuration to those shown in FIG. 1 are referenced with the same reference signs, respectively, and hereinafter, mainly different components will be described.

The angel variable mirrors 7a' and 7b' are configured such that the angle variable mirrors 7a' and 7b' are capable of varying the angle of the light incident plane, respectively. By varying the angle of the light incident plane, the angle variable mirrors 7a' and 7b' can change the interference angle θ to a desired angle. By changing the interference angle θ, it makes it possible to adjustably and arbitrarily change the pitch of the interference fringe of the stripe shape to be formed on the substrate.

Figure 19A:
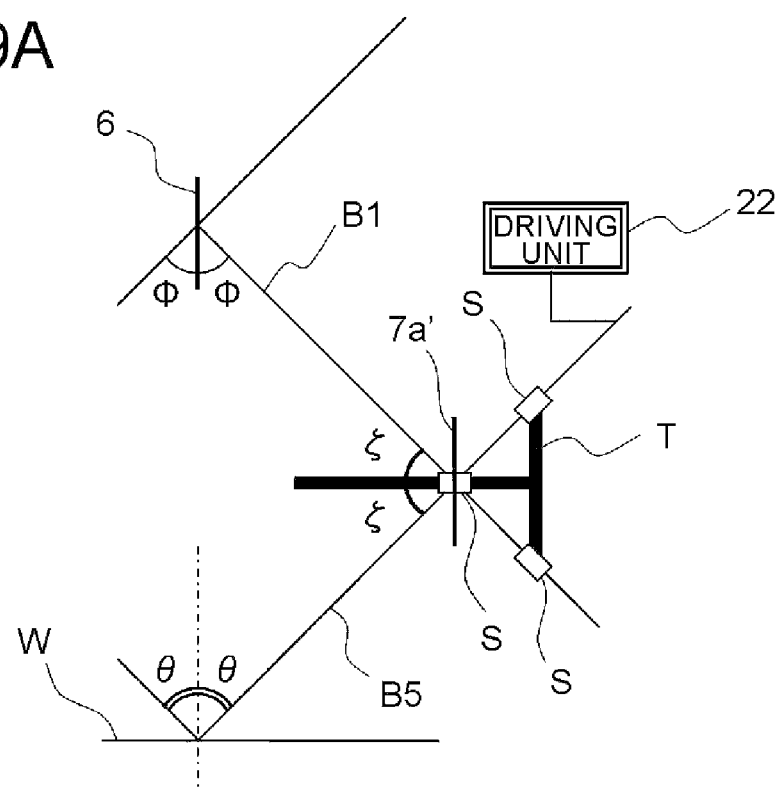
FIG. 19A is a view showing an exemplary mechanism of an angle variable mirror.
Figure 19B:
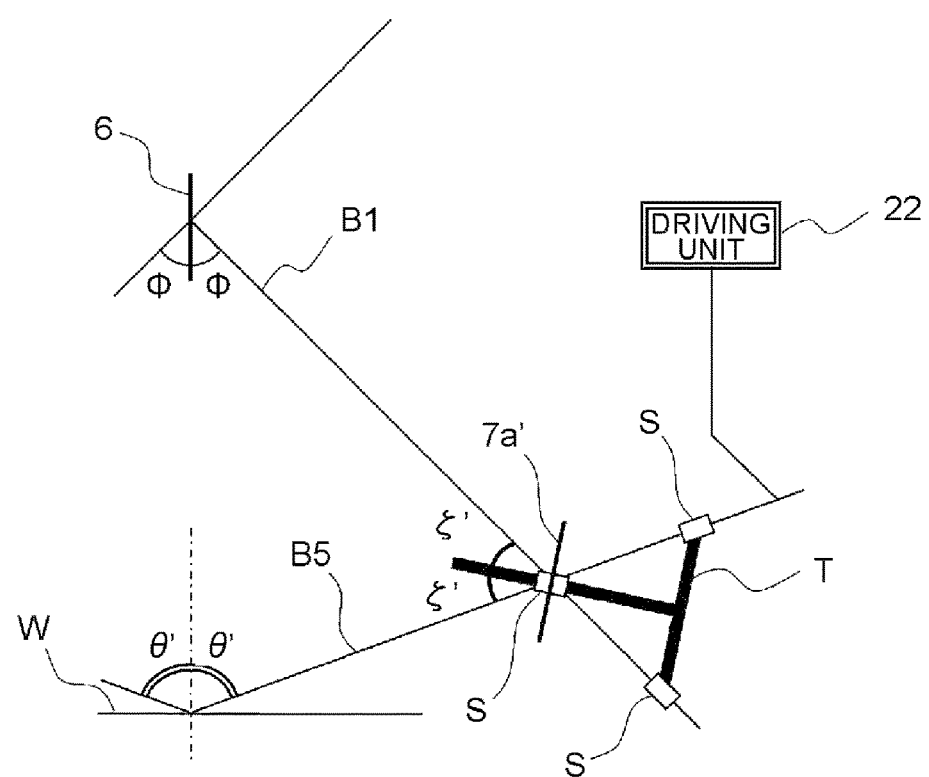
FIG. 19B is a view showing an exemplary mechanism of the angle variable mirror.

FIGS. 19A and 19B are views showing an exemplary mechanism of the angle variable mirrors 7a' and 7b'. As the angel variable mirrors 7a' and 7b' have the same configuration each other, in FIGS. 19A and 19B, the mechanism of the angle variable mirror 7a' is only shown.

The angle variable mirror 7a' (hereinafter also simply referred to as "mirror") is an element for adjusting the interference angle θ to a desired angle. The angle variable mirror 7a' is capable of translating on a straight line constituted by the light beam (i.e., branched light beam) B1 branched by the beam branching element 6, and varying the angle thereof about the axis vertical to a paper surface. The light beam reflected by the mirror 7a' (mirror reflected light beam) B5 is oriented towards a predetermined position on the workpiece W, and combined with the other mirror reflected beam from the other mirror to form the interference fringe. In other words, the normal line of the mirror 7a' is assumed to be a bisector of the angle between the branched light beam B1 and the mirror reflected light beam B5.

As a method for adjusting the interference angle θ while keeping the normal line of the mirror 7a' in the predetermined direction, for example, a link mechanism having a frame T of a T shape may be used, as shown in FIGS. 19A and 19B. The T shaped frame T is provides with three sliders S. Out of three sliders S, each of two sliders S translates on the straight line formed by either the branched light beam B1 or the mirror reflected beam B5. The remaining one slider S is attached to the mirror 7a' and translates on the T shaped frame T.

Also, the rotational axis of the mirror 7a' is constrained at the intersection point of the branched light beam B1 and the mirror reflected light beam B5. When the interference angle θ is adjusted, as shown in FIG. 19A to FIG. 19B, the normal line direction of the mirror 7a' is changed to the predetermined direction, while the bisector of the angle between the branched light beam B1 and the mirror reflected light beam B5 is maintained.

The interference angle θ is adjusted by using a driving unit (i.e., an actuator). The driving unit 22 acts on the frame which is arranged on the straight line formed by the mirror reflected might beam B6 to adjust the interference angle θ.

It should be noted that the driving unit 22 may alternatively have a configuration to act on the T shaped frame T to adjust the interference angle θ.

As described above in detail, according to the present embodiment, the exposure apparatus is provided with the angle variable mirrors 7a' and 7b' which orient (deflect) the branched light beams towards the substrate, respectively, such that two or more branched light beams, which are branched by the beam branching element 6, are crossed at a desired angle. For this reason, it makes it possible to adjustably and arbitrarily change the pitch of the interference fringe of the stripe shape formed on the substrate so as to be applicable to various intended use applications.

While certain embodiments have been described, these embodiments have been presented by way of example only, and are not intended to limit the scope of the present invention. The novel apparatuses and methods thereof described herein may be embodied in a variety of other forms. Furthermore, various omissions, substitutions and modifications in the form of the apparatuses and methods thereof described herein may be made without departing from the gist of the present invention. The accompanying claims and their equivalents are intended to cover such forms or modifications as would fall within the scope and gist of the present invention.

INDUSTRIAL APPLICABILITY

According to an exposure method of the present embodiments, as so-called step and repeat method, which exposes the substrate while conveying the substrate in a stepwise manner, is employed, it makes it possible to downsize the apparatus and achieve a lower cost. Also, in the two-beam interference exposure, the exposure method exposes the substrate such that the interfering light irradiation regions in successive shots are aligned each other in the substrate conveying direction without the interfering light irradiation regions being overlapped. For this reason, it makes it possible to reduce the number of shots as compared to the method that overlaps the interfering light irradiation regions. As a result, it makes it possible to improve the throughput. As described above, according to the present embodiments, it makes it possible to process the micro fabrication onto the substrate with the higher throughput and lower cost.

REFERENCE SIGNS LIST

1 Exposure Apparatus
2 Light Source
3 Beam Expander
4 Deflecting Mirror
5 Shutter
6 Beam Branching Element
7a, 7b Reflecting Mirrors
8a, 8b Condenser Lenses
9a, 9b Pinholes
10a, 10b Collimating Lenses
11 Stage
12 Adhesive Disk
13 Mask (Light Shielding Member)
14 Gap Sensor
20 Controller (Substrate Conveyance Controlling Unit)
21 Stage Driving Circuit
30 Transparent Substrate
40 Thin Film for Grid
41 Pattern
42 Grid 50 Photoresist
51 Resist Pattern
W Workpiece (Substrate)

What is claimed is:

1. An exposure method, comprising:
generating interfering light by crossing, at a predetermined angle, two or more light beams branched from output light from a coherent light source;
arranging a light shielding member having a light transmissive part of a substantially rectangular shape above a substrate;
irradiating the substrate with the interfering light through the light shielding member to shape, into the substantially rectangular shape, an interfering light irradiation region and to cause, at both sides of the interfering light irradiation region, non-interfering light irradiation regions to be generated, the interfering light irradiation region being a region on the substrate on which the interfering light is irradiated per one shot and interference fringes are formed, each of the non-interfering light irradiation regions being a region where only one of the two or more light beams is incident and the interference fringes are not formed;
conveying, in a stepwise manner, the substrate in a conveying direction; and
repeating said irradiating and said conveying so as to form a plurality of said interfering light irradiation regions each having the non-interfering light irradiation regions at the both sides thereof in the conveying direction; wherein
the substrate is conveyed such that one of said plurality of said interfering light irradiation regions is positioned without overlapping next one of said plurality of said interfering light irradiation regions and one of the non-interfering light irradiation regions is positioned with overlapping next one of the non-interfering light irradiation regions so as to separate said plurality of said interfering light irradiation regions solely by the overlapped non-interfering light irradiation regions in the conveying direction, and
each of said plurality of interfering light irradiation regions has a Gaussian distribution.

2. The exposure method according to claim 1, further comprising:
forming the non-interfering light irradiation region irradiated with non-interfering light that is a part of the at least two branched light beams at an end of the interfering light irradiation region, by arranging the light shielding member above the substrate with a predetermined gap being provided; and
disposing a plurality of the non-interfering light irradiation regions that are formed at ends of the neighboring interfering light irradiation regions in the direction of conveying the substrate to be overlapped, when the substrate is exposed while being conveyed in the stepwise manner.

3. The exposure method according to claim 1, further comprising:
forming the non-interfering light irradiation region irradiated with non-interfering light, which is a part of the at least two branched light beams at an end of the interfering light irradiation region, by arranging the light shielding member above the substrate with a predetermined gap being provided; and
disposing the interfering light irradiation region to be overlapped with the non-interfering light irradiation regions that is formed at the end of a neighboring interfering light irradiation region in the direction of conveying the substrate, when the substrate is exposed while being conveyed in the stepwise manner.

4. The exposure method according to claim 1, wherein the light shielding member is arranged directly on the substrate.

5. A method for fabricating a periodic microstructure, comprising:
exposing the substrate by use of the exposure method according to claim 1; and
imparting a physical property corresponding to the interference fringe or forming a pattern corresponding to the interference fringe onto the substrate.

6. A method for fabricating a periodic microstructure, comprising:
a step of exposing the substrate by use of the exposure method according to claim 1; and
a step of developing the substrate after being exposed and forming a pattern corresponding to the interference fringe onto the substrate.

7. A method for fabricating a grid polarizing element, comprising:
a step of forming an inorganic dielectric layer composed of an inorganic dielectric body on a transparent substrate;
a step of forming a photosensitive layer composed of a photosensitive material on the inorganic dielectric layer;
a step of exposing the photosensitive layer by use of the exposure method according to claim 1;
a step of developing the photosensitive layer after being exposed and forming a pattern corresponding to the interference fringe onto the photosensitive layer; and
a step of removing the inorganic dielectric layer by an etching based on the pattern formed on the photosensitive layer and forming a grid layer composed of the inorganic dielectric body, the grid layer having a periodic microstructure.

8. The method for fabricating a grid polarizing element according to claim 7, wherein, in the step of exposing, the photosensitive layer is exposed such that a proportion of an area of a non-interfering light irradiation region with respect to an area of the interfering light irradiation region is less than 0.4%.

9. An exposure apparatus, comprising:
a light source configured to emit coherent light;
an optical system configured to cross two or more light beams at a predetermined interference angle to generate interfering light, the two or more light beams being branched from output light from the light source;
a light shielding member arranged above the substrate and configured to have a light transmissive part of a substantially rectangular shape through which the interfering light generated by the optical system transmits; and
a substrate conveyance controlling unit configured to convey the substrate in a conveying direction and to repeat an irradiation onto the substrate with the interfering light and a conveyance of the substrate, and to expose the substrate, wherein
the optical system irradiates the substrate with the interfering light through the light shielding member to shape, into the substantially rectangular shape, an interfering light irradiation region and to cause, at both sides of the interfering light irradiation region, non-interfering light irradiation regions to be generated, the interfering light irradiation region being a region on the substrate on which the interfering light is irradiated per one shot and interference fringes are formed, each of the non-interfering light irradiation regions being a region where only one of the two or more light beams is incident and the interference fringes are not formed,
a plurality of said interfering light irradiation regions each having the non-interfering light irradiation regions at the both sides thereof are formed in the conveying direction,
the substrate conveyance controlling unit conveys, in a stepwise manner, the substrate such that one of said plurality of interfering light irradiation regions is positioned without overlapping next one of said plurality of said interfering light irradiation regions and one of the non-interfering light irradiation regions is positioned with overlapping next one of the non-interfering light irradiation regions so as to separate said plurality of said interfering light irradiation regions solely by the overlapped noninterfering light irradiation regions in the conveying direction, and
each of said plurality of interfering light irradiation regions has a Gaussian distribution.

10. The exposure apparatus according to claim 9, wherein the optical system includes:
a light branching element configured to branch the output light from the light source into two or more light beams; and
angle variable mirrors configured to deflect the respective branched two or more light beams towards the substrate, respectively, so as to cross the branched two or more light beams branched each other by the light branching element at a desired interference angle.

* * * * *